(12) United States Patent
Oguz et al.

(10) Patent No.: US 11,557,629 B2
(45) Date of Patent: Jan. 17, 2023

(54) SPIN ORBIT MEMORY DEVICES WITH REDUCED MAGNETIC MOMENT AND METHODS OF FABRICATION

(71) Applicant: Intel Corporation, Santa Clara, CA (US)

(72) Inventors: Kaan Oguz, Portland, OR (US); Christopher Wiegand, Portland, OR (US); Noriyuki Sato, Hillsboro, OR (US); Angeline Smith, Hillsboro, OR (US); Tanay Gosavi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 781 days.

(21) Appl. No.: 16/367,133

(22) Filed: Mar. 27, 2019

(65) Prior Publication Data

US 2020/0312908 A1 Oct. 1, 2020

(51) Int. Cl.
| | |
|---|---|
| *H01L 27/22* | (2006.01) |
| *H01L 43/14* | (2006.01) |
| *H01L 43/10* | (2006.01) |
| *H01L 43/06* | (2006.01) |
| *H01L 43/08* | (2006.01) |
| *H01L 43/04* | (2006.01) |

(52) U.S. Cl.
CPC .......... *H01L 27/228* (2013.01); *H01L 43/14* (2013.01); *H01L 43/04* (2013.01); *H01L 43/06* (2013.01); *H01L 43/08* (2013.01); *H01L 43/10* (2013.01)

(58) Field of Classification Search
None
See application file for complete search history.

(56) References Cited

U.S. PATENT DOCUMENTS

| | | | |
|---|---|---|---|
| 5,594,933 A * | 1/1997 | Hayashi | G11B 5/3903 428/548 |
| 6,057,049 A | 5/2000 | Fuke et al. | |
| 6,965,138 B2 | 11/2005 | Nakajima et al. | |
| 7,098,495 B2 | 8/2006 | Sun et al. | |
| 7,538,402 B2 | 5/2009 | Fukumoto | |
| 8,159,870 B2 | 4/2012 | Xia | |
| 8,169,821 B1 | 5/2012 | Ranjan et al. | |
| 8,476,722 B2 | 7/2013 | Lee | |
| 9,251,883 B2 | 2/2016 | Wu et al. | |
| 10,276,784 B1 | 4/2019 | Yu et al. | |

(Continued)

FOREIGN PATENT DOCUMENTS

WO 2017052606 3/2017

*Primary Examiner* — Evren Seven
(74) *Attorney, Agent, or Firm* — Essential Patents Group, LLP

(57) ABSTRACT

A spin orbit memory device includes a material layer stack on a spin orbit electrode. The material layer stack includes a magnetic tunnel junction (MTJ) and a synthetic antiferromagnetic (SAF) structure on the MTJ. The SAF structure includes a first magnet structure and a second magnet structure separated by an antiferromagnetic coupling layer. The first magnet structure includes a first magnet and a second magnet separated by a single layer of a non-magnetic material such as platinum. The second magnet structure includes a stack of bilayers, where each bilayer includes a layer of platinum on a layer of a magnetic material such.

19 Claims, 15 Drawing Sheets

(56) References Cited

U.S. PATENT DOCUMENTS

| | | |
|---|---|---|
| 10,283,701 B1 | 5/2019 | Ikhtiar et al. |
| 10,522,740 B2 | 12/2019 | Chuang et al. |
| 2004/0150017 A1 | 8/2004 | Tsang |
| 2004/0211963 A1 | 10/2004 | Garni et al. |
| 2005/0174836 A1 | 8/2005 | Sharma et al. |
| 2005/0247964 A1 | 11/2005 | Pietambaram et al. |
| 2007/0063237 A1 | 3/2007 | Huai et al. |
| 2007/0183187 A1 | 8/2007 | Guo |
| 2008/0273375 A1 | 11/2008 | Dahmani et al. |
| 2009/0039879 A1* | 2/2009 | Dieny ............... G01R 33/093 324/252 |
| 2009/0166773 A1 | 7/2009 | Ohno et al. |
| 2010/0244163 A1* | 9/2010 | Daibou ............. G11C 11/1673 257/295 |
| 2011/0075476 A1* | 3/2011 | Kajiwara ........... G11C 11/1675 365/170 |
| 2012/0126905 A1 | 5/2012 | Zhang et al. |
| 2012/0163070 A1 | 6/2012 | Nagase et al. |
| 2013/0001506 A1 | 1/2013 | Sato et al. |
| 2013/0001652 A1 | 1/2013 | Yoshikawa et al. |
| 2013/0099780 A1 | 4/2013 | Ma et al. |
| 2014/0021426 A1 | 1/2014 | Lee et al. |
| 2014/0056060 A1 | 2/2014 | Khvalkovskiy et al. |
| 2014/0084398 A1* | 3/2014 | Oguz ..................... H01L 43/10 257/E29.323 |
| 2014/0084938 A1 | 3/2014 | Lai et al. |
| 2014/0145792 A1 | 5/2014 | Wang et al. |
| 2014/0169085 A1* | 6/2014 | Wang ................... H01L 27/228 365/158 |
| 2014/0269035 A1 | 9/2014 | Manipatruni et al. |
| 2014/0306302 A1 | 10/2014 | Guenole et al. |
| 2015/0035095 A1 | 2/2015 | Kim et al. |
| 2015/0061020 A1 | 3/2015 | Yokoyama et al. |
| 2015/0171316 A1 | 6/2015 | Park et al. |
| 2015/0171321 A1 | 6/2015 | Chan et al. |
| 2016/0079518 A1 | 3/2016 | Pi et al. |
| 2016/0163965 A1 | 6/2016 | Han et al. |
| 2016/0225423 A1 | 8/2016 | Naik et al. |
| 2017/0148978 A1 | 5/2017 | Apalkov et al. |
| 2018/0083067 A1 | 3/2018 | Kim et al. |
| 2018/0114898 A1 | 4/2018 | Lee |
| 2018/0123028 A1 | 5/2018 | Shiokawa et al. |
| 2018/0158588 A1 | 6/2018 | Manipatruni et al. |
| 2018/0197589 A1* | 7/2018 | Tang ..................... H01L 27/222 |
| 2018/0219152 A1 | 8/2018 | Apalkov et al. |
| 2018/0248114 A1 | 8/2018 | Oguz et al. |
| 2018/0248115 A1 | 8/2018 | Oguz et al. |
| 2018/0374526 A1 | 12/2018 | Lee et al. |
| 2019/0057731 A1 | 2/2019 | Lua et al. |
| 2019/0081234 A1 | 3/2019 | Naik et al. |
| 2019/0244651 A1 | 8/2019 | Shiokawa et al. |
| 2019/0287589 A1 | 9/2019 | Buyandalai et al. |
| 2019/0304524 A1 | 10/2019 | Oguz et al. |
| 2019/0304653 A1 | 10/2019 | Oguz et al. |
| 2019/0305216 A1 | 10/2019 | Gosavi et al. |
| 2019/0386209 A1 | 12/2019 | Smith et al. |
| 2019/0386662 A1 | 12/2019 | Lin et al. |
| 2020/0006424 A1 | 1/2020 | Sato et al. |
| 2020/0006626 A1 | 1/2020 | Smith et al. |
| 2020/0235289 A1 | 7/2020 | Alam et al. |
| 2020/0273864 A1 | 8/2020 | Manipatruni et al. |
| 2020/0273866 A1 | 8/2020 | Manipatruni et al. |
| 2020/0273867 A1 | 8/2020 | Manipatruni et al. |
| 2020/0303343 A1 | 9/2020 | Manipatruni et al. |
| 2020/0303344 A1 | 9/2020 | Manipatruni et al. |
| 2020/0321344 A1 | 10/2020 | Ramamoorthy et al. |
| 2020/0321472 A1 | 10/2020 | Ramamoorthy et al. |
| 2020/0321473 A1 | 10/2020 | Ramamoorthy et al. |
| 2020/0321474 A1 | 10/2020 | Ramamoorthy et al. |
| 2021/0202507 A1 | 7/2021 | Thareja et al. |
| 2021/0202510 A1 | 7/2021 | Thareja et al. |
| 2021/0202689 A1 | 7/2021 | Thareja et al. |
| 2021/0202690 A1 | 7/2021 | Thareja et al. |
| 2021/0203324 A1 | 7/2021 | Manipatruni et al. |
| 2021/0203325 A1 | 7/2021 | Manipatruni et al. |
| 2021/0203326 A1 | 7/2021 | Manipatruni et al. |
| 2021/0226636 A1 | 7/2021 | Manipatruni et al. |
| 2021/0303981 A1 | 9/2021 | Sasaki et al. |
| 2021/0367142 A1 | 11/2021 | Lee et al. |
| 2022/0068538 A1 | 3/2022 | Apalkov et al. |
| 2022/0131067 A1 | 4/2022 | Kalitsov et al. |

\* cited by examiner

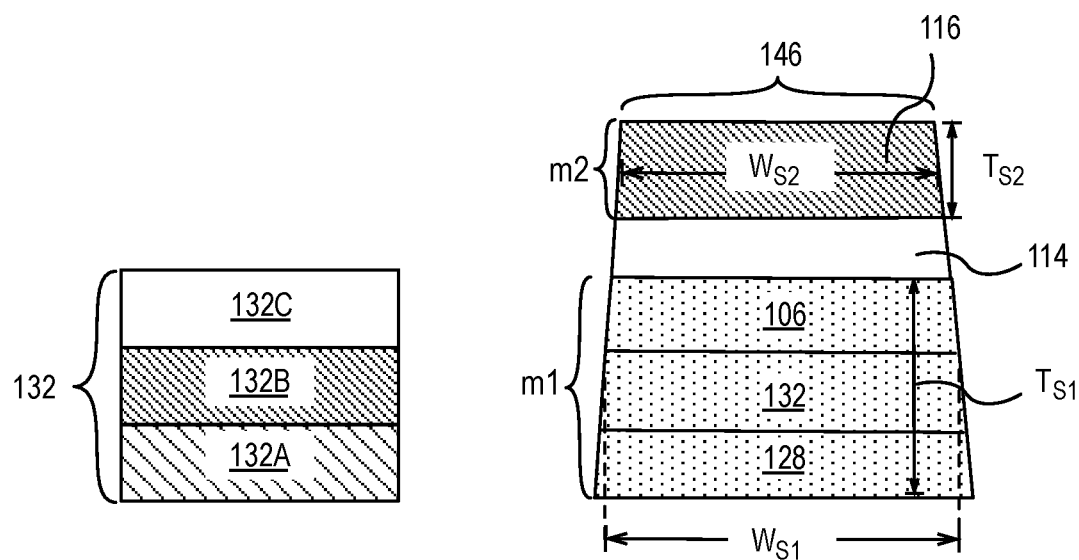
FIG. 1C
FIG. 1D
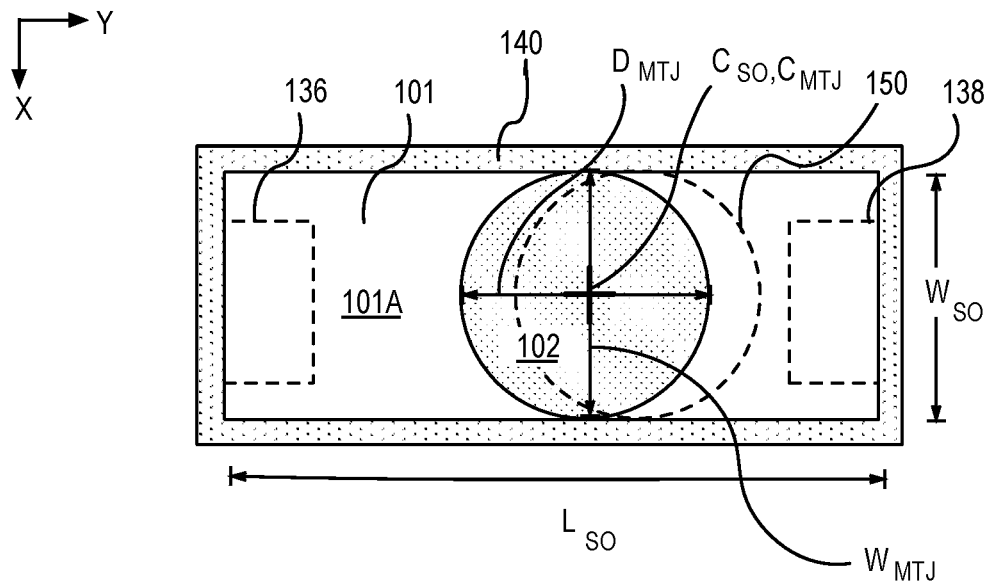
FIG. 1E

SPIN ORBIT MEMORY DEVICES WITH REDUCED MAGNETIC MOMENT AND METHODS OF FABRICATION

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. It has become increasingly significant to rely on innovative devices such as spin orbit memory devices including a spin orbit electrode coupled with a compatible Magnetic Tunnel Junction (MTJ) device to overcome the requirements imposed by scaling.

Non-volatile embedded memory with spin orbit memory devices, e.g., on-chip embedded memory with non-volatility can enable energy and computational efficiency. However, the technical challenges of assembling a material layer stack to form functional spin orbit memory devices present formidable roadblocks to commercialization of this technology today. Specifically, reducing the magnetic moment to lessen impact of magnetic stray fields in a spin orbit memory device is an important area of device development.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1C illustrates a cross-sectional view of a coupling structure including a multilayer stack, in accordance with an embodiment of the present disclosure.

FIG. 1D illustrates a cross-sectional view of a portion of the material layer stack, where layers in the SAF structure and a reference magnet have a tapered sidewall.

FIG. 1E illustrates a plan view of a material layer stack on a spin orbit electrode, in accordance with an embodiment of the present disclosure.

DESCRIPTION OF THE EMBODIMENTS

Figures 1A, 1B:
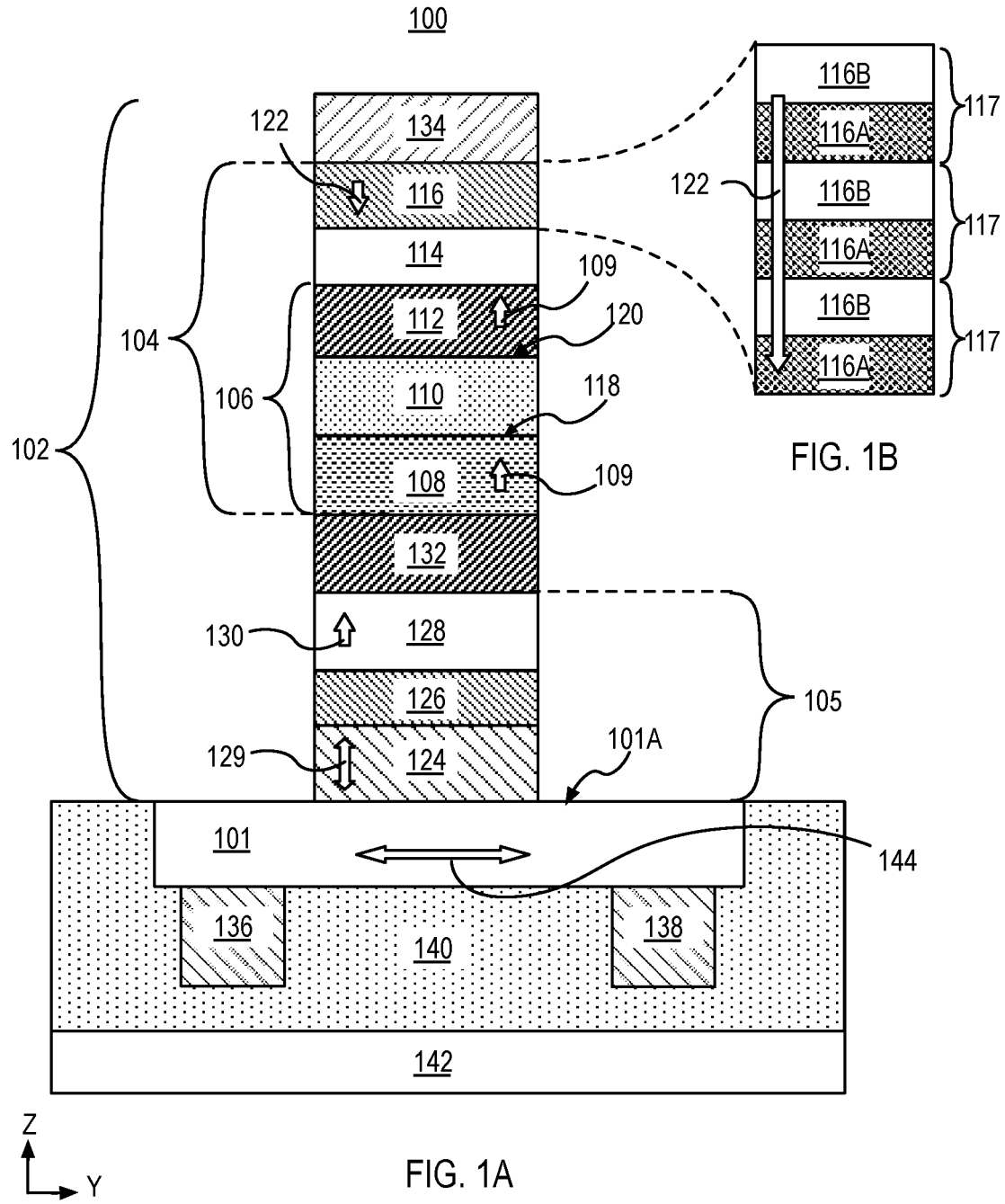
FIG. 1A illustrates a cross-sectional view of a spin orbit memory device including a material layer stack having an SAF structure coupled with a magnetic tunnel junction (MTJ) coupled with a spin orbit electrode, in accordance with an embodiment of the present disclosure.
FIG. 1B illustrates a cross-sectional view of a magnet structure including a plurality of bilayers, in accordance with an embodiment of the present disclosure.

Spin orbit memory devices with reduced magnetic moment and methods of fabrication are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with embedded memory, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, magnetic or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Here, an in-plane magnet refers to a magnet that has magnetization in a direction substantially along the plane of the magnet. For example, a magnet with a magnetization which is in an x or y direction and is in a range of 0 (or 180 degrees) +/−20 degrees relative to an x-y plane of a device.

The term "free" or "unfixed" here with reference to a magnet refers to a magnet whose magnetization direction can change along its easy axis upon application of an external field or force (e.g., Oersted field, spin torque, etc.). Conversely, the term "fixed" or "pinned" here with reference to a magnet refers to a magnet whose magnetization direction is pinned or fixed along an axis and which may not change due to application of an external field (e.g., electrical field, Oersted field, spin torque).

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

A spin orbit memory device may include a magnetic tunnel junction (MTJ) formed on an electrode including a spin orbit material, herein a spin orbit electrode. The MTJ functions as a memory device where the resistance of the MTJ switches between a high resistance state and a low resistance state. The resistance state of an MTJ is defined by the relative orientation of magnetization between a free magnet and a fixed magnet that are separated by a tunnel barrier. When the magnetization of the free magnet and a fixed magnet have orientations that are in the same direction, the MTJ is said to be in a low resistance state. Conversely, when the magnetization of the free magnet and a fixed magnet each have orientations that are in opposite direction to each other, the MTJ is said to be in a high resistance state.

As MTJs are scaled, the need for smaller memory elements to fit into a scaled cell size has driven the industry in the direction of perpendicular MTJ (pMTJ). pMTJ based memory devices or pMTJ devices have a fixed magnet and a free magnet each having a magnetic anisotropy that is perpendicular with respect to a plane of the free magnet. Resistance switching is brought about in a pMTJ device by passing a critical amount of spin polarized current through the pMTJ device so as to influence an orientation of a magnetization in the free magnet to align with a magnetization in the fixed magnet. The act of influencing the magnetization is brought about by a phenomenon known as spin torque transfer, where the torque from the spin polarized current is imparted to the magnetization of the free magnet. By changing the direction of the current, the direction of magnetization in the free magnet may be reversed relative to the direction of magnetization in the fixed magnet. Since the free magnet does not need a constant source of spin polarized current to maintain a magnetization direction, the resistance state of the pMTJ is retained even when there is no current flowing through the pMTJ device. For this reason, the pMTJ device belongs to a class of memory device known as non-volatile memory device. In general a pMTJ device also includes top and bottom electrodes and other layers to improve magnetic performance in addition to the free magnet, fixed magnet and the tunnel barrier.

As a pMTJ device is further scaled down in size, the amount of critical spin polarized current density required to switch the device increases. By implementing a pMTJ device on a spin orbit electrode, the magnetization in the free magnet can switch direction with an assistance of torque provided by a spin Hall current. The spin Hall current may be induced by passing an electrical current in a transverse direction, through the spin orbit electrode. The spin Hall current arises from spin dependent scattering of electrons due to a phenomenon known as spin orbit interaction. Electrons of one spin polarity are directed towards an upper portion of the spin orbit electrode and electrons with an opposite spin polarity are directed toward a bottom portion of the spin orbit electrode. Electrons of a particular spin polarity are diffused toward the free magnet of the pMTJ device and exert a spin orbit torque on the magnetization of the free magnet. While there are benefits of spin Hall current assisted switching through implementation of spin orbit electrodes, engineering of perpendicular magnetic tunnel junction devices with reduced magnetic moment as well as high tunnel magneto-resistance (TMR) ratio continues to be challenging.

TMR ratio is a property of a pMTJ that quantifies a ratio of the difference between a high and a low electrical resistance state in a pMTJ to a low resistance state expressed in percent. In general, a TMR ratio number greater than 100% is considered to be high. A high TMR ratio denotes that a pMTJ can achieve a greater electrical resistance difference between a high level and a low level. A large electrical resistance difference enables a large ensemble of pMTJ devices to be operated in a memory array without undergoing erroneous switching. Low erroneous switching is desirable for adequate read/write margins to enable proper device operation. Conversely, a low TMR ratio may cause read disturb errors. A high TMR ratio allows a greater degree of spin transfer torque for magnetization switching. The TMR ratio depends on the crystallinity of the free magnet and fixed magnet and of the tunnel barrier.

For operational stability, a spin orbit memory device including a pMTJ also includes a synthetic antiferromagnetic (SAF) structure that pins a direction of the magnetization in the fixed magnet. An SAF structure typically includes a plurality of magnetic layers and non-magnetic layers, where a magnetization in the magnetic layers help to fix (or pin) a direction of magnetization in the fixed magnet in the pMTJ. However, an inclusion of the SAF structure increases a total magnetic moment of the pMTJ. In a discrete memory device including a pMTJ, a patterned SAF structure and patterned layers in the pMTJ leads to magnetic stray fields emanating from magnetic layers in the SAF structure from the fixed magnet in the pMTJ. Stray fields can impact switching dynamics of the free layer in the pMTJ. High stray fields can cause an offset field on the free layer leading to write errors and device stability issues. Stray fields are directly proportional to a strength of magnetic field in an SAF structure. The magnetic field, in turn, is dependent on a total magnetic moment of the various magnetic layers in the SAF structure. Thus, it is desirable to reduce the total magnetic moment to reduce impact of stray field on memory devices. Because the total magnetic moment in an SAF helps to maintain perpendicular magnetic anisotropy (PMA) in the fixed magnet, the SAF structure may not be arbitrarily decided. In some SAF structures, a material such as platinum is utilized to help achieve perpendicular magnetic anisotropy. In some examples, interleaving layers of platinum and a magnetic material may be present in a multi-layer stack in an SAF structure to help achieve PMA. The greater the number of interleaved layers, the greater the interfacial magnetic anisotropy. However, platinum also has some disadvantages in that it has a strong affinity for iron. When iron is present in the fixed or free magnetic layers in the memory device, iron can diffuse and combine with platinum due to undesirable texturing effects of Pt layers. For example, Pt forms FCC (111) textured films. Thus, while multilayer stacks with platinum can increase PMA, such a stack can also lead to loss in TMR due to iron diffusion and undesirable texturing effects.

In some embodiments, an SAF structure includes a first magnet structure and a second magnet structure that are separated by conductive coupling layer. The first magnet structure may be in proximity with a fixed magnet and be ferromagnetically coupled with the fixed magnet. The first magnet structure and the fixed magnet may be anti-ferromagnetically coupled with the second magnet structure that is above the first magnet structure. In some examples, both the first and the second magnet structures may include multilayer stacks of interleaved layers of platinum and a magnetic material. However, in such an SAF structure, it is desirable to have a reduced amount of platinum/magnet bilayer repetitions in the first magnet structure.

The inventors have found that by implementing a first magnet structure having a single layer of platinum between two thin layers of magnet can simultaneously reduce total magnetic moment and increase TMR. By reducing the total magnetic moment in the first magnet structure, the number of interleaved layers in the second magnet structure may also be reduced as a lower magnetic moment is needed. Reducing the amount of platinum/magnet bilayer repetitions in the second magnet structure may effectively lower the total magnetic moment of the SAF structure and the fixed magnet.

FIG. 1A is an illustration of a cross-sectional view of a memory device 100, in accordance with an embodiment of the present disclosure. In the illustrative embodiment, the memory device 100 is a spin orbit memory device 100. The spin orbit memory device 100 includes an electrode 101 having a spin orbit material. The electrode 101 is herein referred to as a spin orbit electrode 101. The spin orbit memory device 100 further includes a material layer stack 102 on a portion of the spin orbit electrode 101. The material layer stack 102 includes a synthetic anti-ferromagnet (SAF) structure 104 above a magnetic junction 105. The SAF structure 104 includes a magnet structure 106 including a magnetic layer 108 having a magnetization 109, a layer including a conductive material 110 (herein conductive layer 110) on the magnetic layer 108 and a second magnetic layer 112 having the magnetization 109 on the conductive layer 110. The SAF structure 104 further includes a layer 114 (herein anti-ferromagnetic or AFM coupling layer 114) on the magnet structure 106 and a magnet structure 116 on the AFM coupling layer 114.

The magnet structure 106 includes materials and has a combined thickness that is suitable to possess a perpendicular magnetic anisotropy (PMA). A PMA in magnet structure 106 is indicated by the direction of magnetization 109 (along the positive Z-direction) in the magnetic layers 108 and 112. The magnetic layer 108 and the magnetic layer 112 each include materials that are substantially free of iron. In an embodiment, the magnetic layer 108 and magnetic layer 112 each include a material such as cobalt. In some such embodiments, the cobalt material has a different thickness in the magnetic layer 108 compared to in the magnetic layer 112. In an embodiment, the magnetic layer 108 has a thickness between 0.3 nm and 0.6 nm. In one such embodiment, the magnetic layer 112 has a thickness between 0.4 and 0.8 nm. In an embodiment, magnetic layer 108 includes cobalt and has a thickness of approximately 0.4 nm and the magnetic layer 112 includes cobalt and has a thickness of approximately 0.6 nm.

The conductive layer 110 includes a material that is not magnetic. The conductive layer 110 adjacent to a magnetic material provides perpendicular interfacial magnetic anisotropy in the magnet structure 106. For example, the conductive layer 110 may include a noble metal such as platinum. An interface 118 between a Pt conductive layer 110 and magnetic layer 108 provides an interfacial PMA to the magnetic layer 108. Similarly, an interface 120 between the Pt conductive layer 110 and magnetic layer 112 provides an interfacial PMA to the magnetic layer 112. An increase in the number of platinum and magnetic layers can increase PMA and hence magnetic moment. Thus, the presence of a single platinum conductive layer 110 between two magnetic layers 108 and 112 can reduce magnetic moment in the magnet structure. Reducing the magnetic moment in the magnet structure 106 can help to reduce undesirable stray magnetic field in the memory device 100. In an embodiment, the conductive layer 110 has a thickness between 1 nm and 2.0 nm. A thickness between 1 nm and 2.0 nm is sufficiently thin for ferromagnetic coupling between the magnetic layers 108 and 112.

The magnet structure 116 includes materials and has a combined thickness that is suitable to possess a perpendicular magnetic anisotropy (PMA). Magnet structure 116 has a magnetization 122 as illustrated. In the illustrative embodiment, the magnetization 122 is in a direction that is opposite to the direction of magnetization 109 in the magnet structure 106.

In an embodiment, the magnet structure 116 includes a plurality of bilayers. FIG. 1B illustrates a cross-sectional view of a plurality of bilayers 117. In some examples, such as in the example illustrated, each bilayer 117 includes a magnetic layer 116A and a non-magnetic layer 116B on the magnetic layer 116A. The number of bilayers ranges between 3 and 10. As the number of bilayers decreases from 10 to 3, the magnet structure 116 can have a smaller magnetic moment.

In an embodiment, the magnetic layer 116A includes a material that is substantially free of iron. In an embodiment, the magnetic layer 116A includes a material such as cobalt. In an embodiment, the magnetic layer 116A has a thickness between 0.2 nm and 1.0 nm. In some such embodiments, the cobalt in the magnetic layer 116A has a thickness that is less than a combined thickness of the cobalt in the magnetic layers 108 and 112. In an embodiment, the non-magnetic layer 116B includes Pt. In an embodiment, the non-magnetic layer 116B includes Pt and has a thickness between 0.4 nm and 2.0 nm.

Referring again to FIG. 1A, in an embodiment, the conductive layer 110 includes platinum and each of the non-magnetic layers in the magnet structure 116 includes platinum. In an embodiment, the conductive layer 110 including platinum has a thickness that is less than a combined thickness of each non-magnetic layer including platinum in the magnet structure 116.

In an embodiment, the AFM coupling layer 114 includes a layer of ruthenium or iridium. For example, a ruthenium-based AFM coupling layer 114 may have a thickness between 0.3 nm and 1.0 nm to ensure that the coupling between the magnet structure 106 and the magnet structure 116 is anti-ferromagnetic.

In an exemplary embodiment, magnetic junction 105 is a magnetic tunnel junction (MTJ) 105. In some such embodiments, the MTJ 105 is a perpendicular MTJ (pMTJ) 105. In the illustrative embodiment, the pMTJ 105 includes a magnet 124 on the spin orbit electrode 101, a tunnel barrier 126 on the magnet 124 and a magnet 128 on the tunnel barrier 126.

The magnet 124 has a magnetization 129 (indicated by a bi-directional arrow) that may change orientation during operation. For example, magnetization 129 may orient in the positive or negative Z-direction as indicated by the bi-directional arrow. Such a magnet 124 is herein referred to as a free magnet 124. The direction of magnetization 129 is perpendicular to a plane of an uppermost surface 101A of the spin orbit electrode 101. The free magnet 124 having a magnetization 130 that is perpendicular to the plane of the uppermost surface 101A may also be known as a perpendicular free magnet 124.

The magnet 128 has a magnetization 130 that remains fixed during operation. For example, magnetization 130 may orient in the positive or in a negative Z-direction. In the illustrative embodiment, the magnetization 130 is parallel to magnetization 109 in the magnet structure 106. Such a magnet 128 is herein referred to as a fixed magnet 128. The direction of magnetization 130 is perpendicular to a plane of an uppermost surface 101A of the spin orbit electrode 101. The fixed magnet 128 having a magnetization 130 that is perpendicular to the plane of the uppermost surface 101A may also be known as a perpendicular fixed magnet 128.

In the illustrative embodiment, the spin orbit memory device 100 includes an additional spacer layer 132 between the fixed magnet 128 and magnet structure 106. In an embodiment, the spacer layer 132 includes a metal such as tantalum, molybdenum or tungsten. A metal such as tantalum or tungsten provides ferromagnetic coupling between the magnet structure 106 and the fixed magnet 128. In an embodiment, a tantalum or tungsten spacer layer 132 has a thickness that is between 0.2 nm-0.7 nm.

In an embodiment, spin orbit electrode 101 includes a material having a high spin Hall efficiency. When a charge current is passed through the spin orbit electrode 101, having a high spin Hall efficiency, a large spin all current is generated in a direction (Z-axis) transverse to the charge current 144 (Y-axis). A large spin Hall current can provide a spin polarized current to the free magnet 124. A spin Hall current induced spin polarized current can provide spin-transfer torque and influence the magnetization of the free magnet 124. In an embodiment, the beta phase material is tantalum. In other embodiments the beta phase material is tungsten. In an embodiment, the spin orbit electrode 101 has a thickness between 5 nm and 20 nm.

In the illustrative embodiment, each of the free magnet 124 includes a magnetic material such as Co, Ni, Fe or alloys of these materials. In an embodiment, the free magnet 124 includes a magnetic material such as CoB, FeB, CoFe or CoFeB. In some embodiments, the free magnet 124 includes a $Co_{100-x-y}Fe_xB_y$, where X and Y each represent atomic percent, further where X is between 50 and 80 and Y is between 10 and 40, and further where the sum of X and Y is less than 100. In one specific embodiment, X is 60 and Y is 20. In an embodiment, the free magnet 124 is FeB, where the concentration of boron is between 10 and 40 atomic percent of the total composition of the FeB alloy. In an embodiment, free magnet 124 has a thickness in the range of 0.5 nm to 2 nm.

In an embodiment, tunnel barrier 126 includes a material suitable for allowing electron current having a majority spin to pass through tunnel barrier 126, while impeding, at least to some extent, electron current having a minority spin from passing through tunnel barrier 126. Thus, tunnel barrier 126 (or spin filter layer) may also be referred to as a tunneling layer for electron current of a particular spin orientation. In an embodiment, tunnel barrier 126 includes a material such as, but not limited to, oxygen and at least one of magnesium (e.g., a magnesium oxide, or MgO), or aluminum (e.g., an aluminum oxide such as $Al_2O_3$). In an embodiment, tunnel barrier 126 including MgO has a crystal orientation that is (001) and is lattice matched to free magnet 124 below tunnel barrier 126 and fixed magnet 128 above tunnel barrier 126. In an embodiment, tunnel barrier 126 is MgO and has a thickness in the range of 0.5 nm to 3 nm. In an embodiment, a free magnet 124 including a $Co_{100-x-y}Fe_xB_y$, is highly lattice matched to the tunnel barrier 126 including an MgO. Lattice matching between a crystal structure of the free magnet 124 and the tunnel barrier 126 enables a higher tunneling magnetoresistance (TMR) ratio in the pMTJ 105.

In some embodiments, the fixed magnet 128 includes a material and has a thickness sufficient for maintaining a fixed magnetization. In an embodiment, the fixed magnet 128 of the pMTJ 105 includes an alloy such as CoFe or CoFeB. In an embodiment, the fixed magnet 128 comprises a $Co_{100-x-y}Fe_xB_y$, where X and Y each represent atomic percent, further where X is between 50-80 and Y is between 10 and 40, and further where the sum of X and Y is less than 100. In one specific embodiment, X is 60 and Y is 20. In an embodiment, the fixed magnet 128 is FeB, where the concentration of boron is between 10 and 40 atomic percent of the total composition of the FeB alloy. In an embodiment the fixed magnet 128 has a thickness that is between 0.5 nm and 2 nm.

The memory device 100 further includes a top electrode 134 above the SAF structure 104. In the illustrative embodiment, the top electrode 134 is on the SAF structure 104. The top electrode 134 may include a material such as Ta or TiN. In an embodiment, the top electrode 134 has a thickness between 5 nm and 70 nm.

The spin orbit electrode 101 is coupled to a pair of conductive interconnects 136 and 138 in a dielectric 140 above a substrate 142 to enable transmission of charge current 144 during operation of spin orbit memory device 100. In the illustrative embodiment, the conductive interconnect 136 is laterally separated from conductive interconnect 138. The material layer stack 102 is laterally in between (along Y axis), but, on a plane above the conductive interconnects 136 and 138. In other embodiments, the spin orbit memory device 100 may include a single conductive interconnect such as a conductive interconnect 136 or 138 below the spin orbit electrode 101. In some such embodiments, a second of the conductive interconnect 138 or 136 is above the spin orbit electrode 101. The conductive interconnects 136 or 138 remain laterally separated with the pMTJ 102 in between in all embodiments for a three terminal spin orbit memory device 100. In an embodiment, the conductive interconnects 136 and 138 each include a barrier layer, such as tantalum nitride, and a fill metal, such as copper, tungsten or ruthenium.

In the illustrative embodiment, the spin orbit electrode 101 and the conductive interconnects 136 and 138 are adjacent to a dielectric 140. In an embodiment, the dielectric 140 includes silicon and at least one of oxygen or nitrogen. The dielectric material is above a substrate 142 as shown in FIG. 1A. In an embodiment, the substrate 142 includes a suitable semiconductor material such as but not limited to, single crystal silicon, polycrystalline silicon and silicon on insulator (SOI). In another embodiment, substrate 142 includes other semiconductor materials such as germanium, silicon germanium or a suitable group III-N or a group III-V compound. Logic devices such as MOSFET transistors and access transistors and may be formed on the substrate 142. Logic devices such as access transistors may be integrated with memory devices such as spin orbit memory device to form embedded memory. Embedded memory including spin orbit memory devices and a logic MOSFET transistors may be combined to form functional integrated circuit such as a system on chip.

While the various embodiments here are illustrated with reference to a pMTJ 105 over a spin orbit electrode 101, the embodiments are also applicable to spin valves. In an embodiment, a spin valve device includes a layer 126 that is a metal oxide or a metal between the free magnet 124 and fixed magnet 128, instead of a tunneling dielectric MgO.

In some examples, the spacer layer 132 may be spacer structure 132 that includes a multilayer stack, such as is shown, in the cross-sectional illustration of FIG. 1C. As shown, the multi-layer stack includes a non-magnetic layer, a magnetic layer 132B on the non-magnetic layer 132A and a non-magnetic layer 132C on the magnetic layer 132B. In the illustrative embodiment, the non-magnetic layer 132A includes molybdenum, the magnetic layer 132B includes cobalt, iron and boron, and the non-magnetic layer 132C includes Ta. In some such embodiments, the cobalt, iron and boron in the magnetic layer 132B has a boron composition of up to 30 atomic percent.

The spacer structure 132 has a combined thickness of the layers 132A, 132B and 132C that provides ferromagnetic coupling between the fixed magnet 128 and magnet structure 106. The ferromagnetically coupling pins the magnetization 130 in the fixed magnet 128 to the magnetization 109 in the magnet structure 106. In some embodiments, the spacer structure 132 has a combined thickness of the layers 132A, 132B and 132C that is less than 2 nm.

FIG. 1D illustrates the material layer stack 102. The portion 146 has a tapered profile, where each layer itself has a tapered profile. The profile and thickness of the various layers in the portion 146 affects a property called the net magnetic moment. The spacer structure 132 in FIG. 1D is the spacer structure described in association with FIG. 1C.

The magnetic materials in fixed magnet 128, the spacer structure 132 and the magnet structure 106 have a net magnetic moment, $m_1$ as denoted in FIG. 1D. The fixed magnet 128, the spacer structure 132 and the magnet structure 106 have a combined thickness $T_{S1}$, and an average width $W_{S1}$. The average width $W_{S1}$ is partially determined by a patterning process to be discussed further below. The fixed magnet 128, the spacer structure 132 and the magnet structure 106 have a combined volume, $V_1$ that is proportional to $T_{S1}$ and $W_{S1}$. The product of the magnetization, $M_1$ and the average volume $V_1$ determines a net magnetic moment, $m_1$, in the fixed magnet 128, the spacer structure 132 and the magnet structure 106.

The magnetic materials in the magnet structure 116 have a net magnetic moment, $m_2$, as denoted. The magnet structure 116 has a thickness $T_{S2}$, and an average width $W_{S2}$ and an average volume, $V_2$ (not shown in FIG. 1D) that is proportional to $T_{S2}$ and $W_{S2}$. The average width $W_{S2}$ is partially determined by a patterning process to be discussed further below. The product of the magnetic moment, $M_2$ and the average volume $V_2$ determines a net magnetic moment, $m_2$ in the magnet structure 116.

In an embodiment, the net magnetic moment, $m_1$ is substantially equal to the net magnetic moment, $m_2$ in the magnet structure 116. A substantially equal $m_1$ and $m_2$, decreases the total magnetic stray field and hence increases switching efficiency of the memory device 100. The switching efficiency is increased because the fixed magnet 128 is pinned by the SAF structure 104 during operation. A well pinned fixed magnet 128 can help to also increase the tunneling magneto resistance ratio in the memory device 100.

In an embodiment, the net magnetic moment, $m_1$ is substantially equal to the net magnetic moment, $m_2$ in the magnet structure 116. A substantially equal $m_1$ and $m_2$, decreases the total magnetic stray field and hence increases switching efficiency of the memory device 100. The switching efficiency is increased because the fixed magnet 128 is pinned by the SAF structure 104 during operation. A well pinned fixed magnet 128 can help to also increase the tunneling magneto resistance ratio in the memory device 100.

The magnetic moment is equal to the product of the magnetization and volume. In an embodiment, when $m_1 \sim m_2$, then, $$M_1 V_1 \sim M_2 V_2 \quad [1]$$

The volume is dominated by volume of magnetic layers such as fixed magnet 128 and magnetic structure 106. In the illustrative embodiment, the volume is proportional to a product of width and thickness or $V \sim (W) \cdot (T)$, for each layer. For the combined volume $V_1$, $$V_1 (W_{S1}) \cdot (T_{S1}). \quad [2]$$

for volume $V_2$, $$V_2 \sim (W_{S2}) \cdot (T_{S2}) \quad [3]$$

Hence, the relationship [1] between magnetic moment $m_1$ and $m_2$ may be expressed in terms of width and thickness by substituting relations [2] and [3] in relation [1] to obtain relation [4]:

$$M_1 (W_{S1} \cdot T_{S1}) \sim M_2 (W_{S2} \cdot T_{S2}) \quad [4]$$

In an embodiment, where $M_1 < M_2$, and where $W_{S1}$ and $W_{S2}$ are substantially similar, the thickness of $T_{S1}$ and $T_{S2}$ may be proportioned to obtain substantially equivalent magnetic moments. In such an embodiment, $T_{S1}$ is greater than $T_{S2}$ for relation [4] to be satisfied.

In some embodiments, a memory device illustrated in FIG. 1D, has tapered sidewalls as shown. A tapered sidewall may increase an average width of each successively lower layer or structure in portion 146. For example, as shown $W_{S1}$ is greater than $W_{S2}$, when sidewalls are tapered. In one such embodiment, where $M_1 < M_2$, and where $W_{S1} > W_{S2}$, $T_{S1}$ can be approximately equal to $T_{S2}$ for relation [4] to be satisfied. In another embodiment, where $M_1$ $M_2$, and where $W_{S1} > W_{S2}$, $T_{S1}$ can be less than $T_{S2}$ for relation [4] to be satisfied. Reducing $T_{S1}$ has a practical advantage from a fabrication perspective as in some examples, materials such as platinum in magnetic structure 106 can taper during a patterning process. Tapering can increase volume, and for a given magnetization tapering can cause an unwarranted increase in the magnetic moment. Hence, reduction in $T_{S1}$ without impacting magnetization is desirable, such as for example by implementing a magnet structure 106.

A size and shape of the spin orbit electrode 101 may affect the magnitude of a spin Hall current that is generated in the spin orbit electrode 101. In an embodiment, the spin orbit electrode 101 has a rectangular profile as shown in the plan view illustration of FIG. 1E. In some such embodiments, a rectangular uppermost surface 101A has a length, $L_{SO}$, along the Y-direction. As shown, the material layer stack 102 has a circular plan view profile. In some such embodiments, a bottom surface of the material layer stack 102 has a diameter, $D_{MTJ}$. In an embodiment, $L_{SO}$ is at least three times greater than $D_{MTJ}$. In an embodiment, the spin orbit electrode 101 has a length, $L_{SO}$, between 50 nm and 500 nm. In an embodiment, $D_{MTJ}$ is between 10 nm and 50 nm. In other embodiments, the material layer stack 102 has a plan view profile that is rectangular or elliptical.

In the illustrative embodiment, the spin orbit electrode 101 has a width, $W_{SO}$, along the X-direction as shown. In some embodiments, $W_{SO}$, is between 10 nm and 50 nm. As shown, the material layer stack 102 has a broadest cross-sectional width, $W_{MTJ}$, along the direction of the width, $W_{SO}$. In an embodiment, $W_{MTJ}$ is the same or substantially the same as $W_{SO}$. In an embodiment, the material layer stack 102 has a broadest cross-sectional width, $W_{MTJ}$, that is between 10 nm and 50 nm. $W_{MTJ}$ may be smaller than $W_{SO}$ in other examples.

In an embodiment, the material layer stack 102 has a center, $C_{MTJ}$ and the spin orbit electrode 101 has a center, $C_{SO}$, as illustrated in FIG. 1E. In an embodiment, $C_{MTJ}$ is aligned to $C_{SO}$ in X and Y directions, as illustrated. In another embodiment, $C_{MTJ}$ is misaligned from the $C_{SO}$ in the Y-direction. An example of a material layer stack 102 that is misaligned is indicated by dashed lines 150. Misalignment may range between 10 nm and 30 nm in X and/or Y directions. The electrical resistivity of the spin orbit electrode 101 may determine a position of the material layer stack 102 relative to the spin orbit electrode 101 along the Y-direction in FIG. 1E.

In the illustrative embodiment, the conductive interconnects 136 and 138 (indicated by dashed lines) do not extend beyond the spin orbit electrode 101. In other embodiments, portions of the conductive interconnects 136 and 138 may extend beyond the spin orbit electrode 101.

Figure 2:
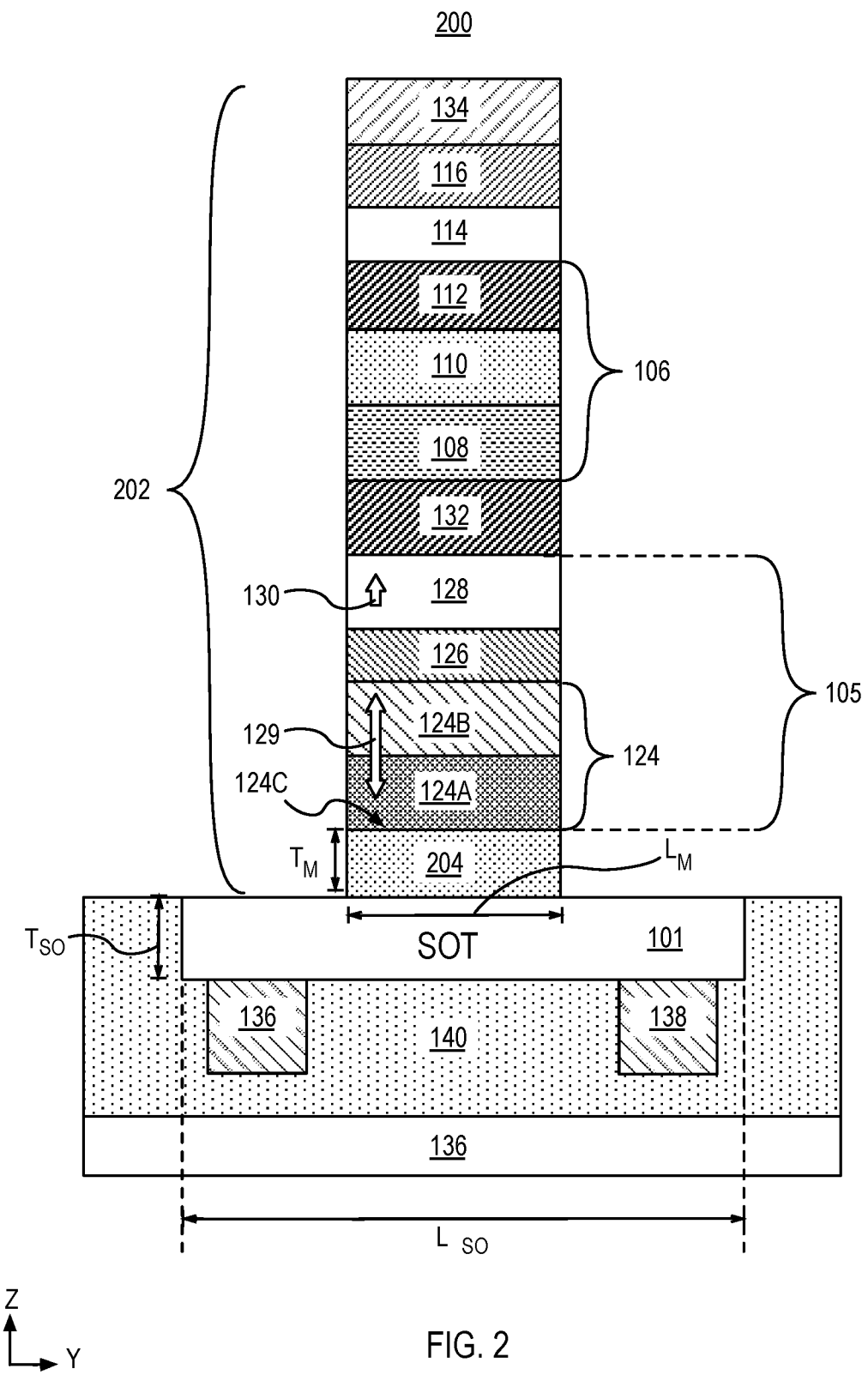
FIG. 2 illustrates a cross-sectional view of the spin orbit memory device in FIG. 1A having an additional layer between the material layer stack and the spin orbit electrode and having a bilayer free magnet structure instead of a single free magnet, in accordance with an embodiment of the present disclosure.

FIG. 2 illustrates a memory device 200 having a material layer stack 202 that has an additional intermediate layer 204 between the spin orbit electrode 101 and free magnet 124 compared to material layer stack 102 illustrated in FIG. 1A. Referring to FIG. 2, the free magnet 124 is a free magnet structure 124 that includes a first magnet 124A and second magnet 124B on the first magnet 124A. The free magnet structure 124 has a combined magnetization 129 that may orient in the positive or negative Z-direction (as indicated by the bi-directional arrow). The Z axis in FIG. 2 is perpendicular to a plane of a lowermost surface 124C of the free magnet 124A. The free magnet structure 124 may also be known as a perpendicular free magnet structure 124.

In one embodiment, the spin orbit electrode 101 includes a material such as tantalum or tungsten having a beta-phase cubic structure. The crystallinity of the free magnet structure 124 may be influenced by the crystal phase of the material of the spin orbit electrode 101. The intermediate layer 204 includes molybdenum having a body centered cubic (bcc) phase and provides a buffer for the free magnet structure 124. When the free magnet 124A is adjacent to a molybdenum intermediate layer 204, the free magnet 124A has a body centered cubic (bcc) crystal structure. A measurement of the intrinsic TMR ratio after formation of the material layer stack 202 has a TMR ratio of almost 140%. A TMR above 100% may be indicative of a high degree of bcc crystallinity in the free magnet structure 124.

Molybdenum has a lower electrical resistivity compared to tantalum and an electrical resistivity that is comparable to tungsten. The molybdenum layer 204 has lateral and vertical dimensions (along Y and Z directions respectively) that are less than lateral and vertical dimensions of the spin orbit electrode 101 to have a greater electrical resistance than spin orbit electrode 101. A greater electrical resistance may force a charge current 144 to traverse a path through the spin orbit electrode 101 rather than traverse through the molybdenum layer 204.

In an embodiment the layer 204 has a thickness TM that is less than a thickness, $T_{SO}$, of the spin orbit electrode 101. In an embodiment, the layer 204 has a thickness between 0.2 nm and 1.0 nm. A thickness between 0.2 nm and 1.0 nm may be sufficiently thin such that charge current 144 is confined in spin orbit electrode 101 during operation of memory device 200.

In the illustrative embodiment, the layer 204 has a length $L_M$, that is less than a length, $L_{SO}$, of the spin orbit electrode 101. In one such embodiment, the charge current 144 is confined in spin orbit electrode 101 in regions not covered by the layer 204. In other embodiments, when $L_M$ is less than a length, $L_{SO}$, the charge current 144 is confined in the entire spin orbit electrode 101. In a third embodiment, when $L_M$ is less than $L_{SO}$ and $T_M$ is less than $T_{SO}$, the charge current 144 is confined in the entire spin orbit electrode 101, including portions directly under the layer 204, during operation of memory device 200.

In an embodiment, the free magnet 124A and the free magnet 124B each include $Co_{100-x-y}Fe_xB_y$, where X and Y each represent atomic percent. In one such embodiment, free magnet 124A has between 30 and 40 atomic percent of boron in $Co_{100-x-y}Fe_xB_y$, and free magnet 124B has between 20 to 25 atomic percent of boron in $Co_{100-x-y}Fe_xB_y$. In embodiments, when the free magnet 124A has between 30 and 40 atomic percent of boron in $Co_{100-x-y}Fe_xB_y$, and free magnet 124B has between 20 to 25 atomic percent of boron in $Co_{100-x-y}Fe_xB_y$, the iron to cobalt ratio is substantially three to one.

In an embodiment, the memory device 200 includes a bcc molybdenum layer 204, and a free magnet 124A includes $Co_{100-x-y}Fe_xB_y$ (where Y is between 30 and 40) that is substantially lattice matched to the bcc molybdenum layer 204. In one such embodiment, free magnet 124B includes $Co_{100-x-y}Fe_xB_y$ (where Y is between 20 and 25) that is also substantially lattice matched to the bcc molybdenum layer 204 and to the free magnet 124A including $Co_{100-x-y}Fe_xB_y$ (where Y is between 30 and 40). Lattice matching a crystal structure of the free magnets 124A and 124B with the bcc molybdenum layer 204 enables a higher tunneling magnetoresistance (TMR) ratio in the memory device 200.

In one embodiment, free magnet 124A has a thickness in the range of 0.5 nm to 1.5 nm and free magnet 124B has a thickness in the range of 0.5 nm to 1.0 nm. In one example, the free magnet structure 124 has a combined total thickness of free magnet 124A and free magnet 124B in the range of 0.5 nm to 2.0 nm. A thickness of less than 1.6 nm enables perpendicular magnetization in the free magnet structure 124.

In an embodiment, free magnet 124A includes $Co_{100-x-y}Fe_xB_y$ (where Y is between 30 and 40) and has a thickness in the range of 0.5 nm to 1.0 nm and free magnet 124B includes $Co_{100-x-y}Fe_xB_y$ (where Y is between 20 to 25) and has a thickness in the range of 0.5 nm to 1.5 nm.

Figure 3A:
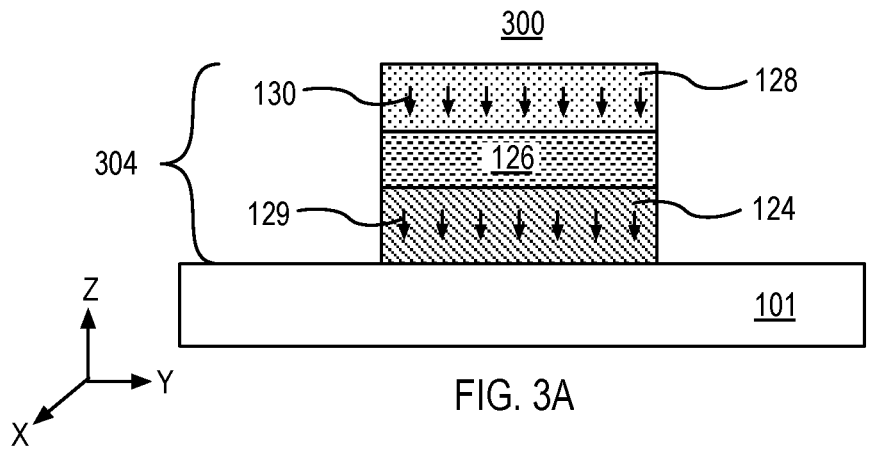
FIG. 3A illustrates a spin orbit memory device in a low resistance state.
Figure 3B:
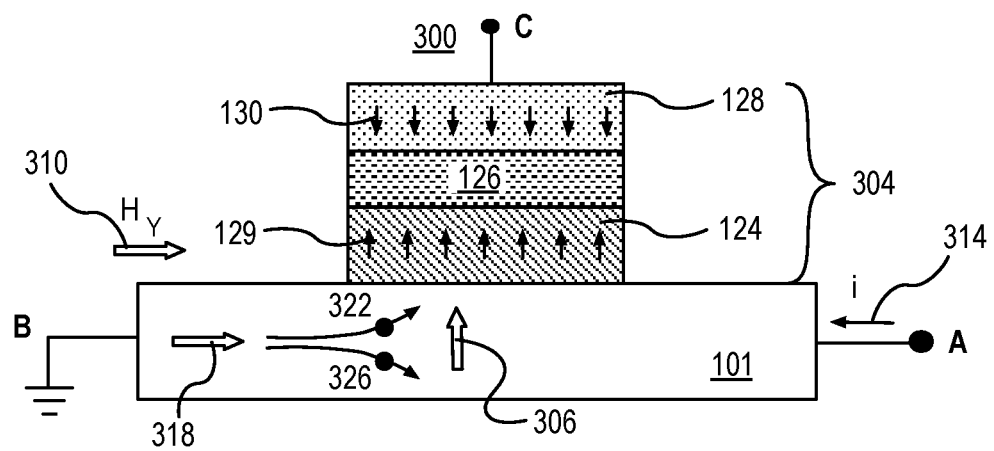
FIG. 3B illustrates a spin orbit memory device switched to a high resistance state after the application of a spin Hall current.
Figure 3C:
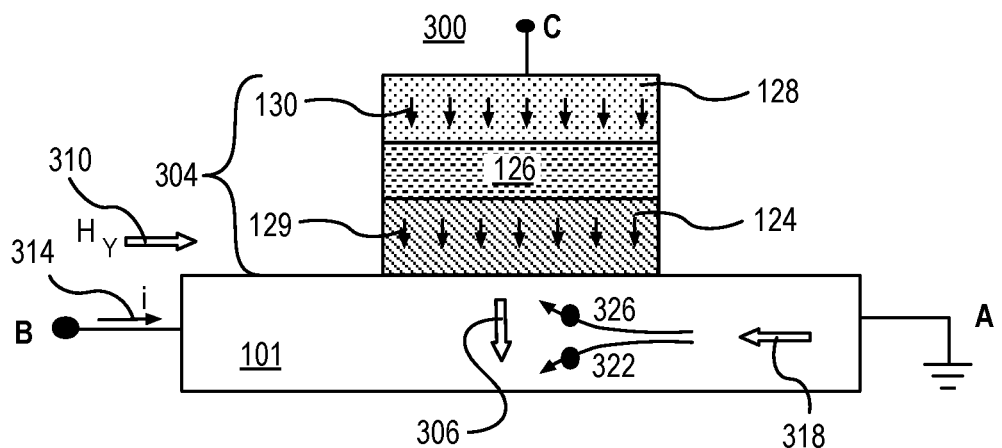
FIG. 3C illustrates a spin orbit memory device switched to a low resistance state after the application of a spin Hall current.

FIGS. 3A-3C illustrate a mechanism for switching a spin orbit memory device such as a spin orbit memory device 300 including a pMTJ 304 on the electrode 101 including a spin orbit material. In the illustrative embodiment, the pMTJ 304 includes one or more features of the pMTJ 105 (FIG. 1A), such as the free magnet 124, the fixed magnet 128 and the tunnel barrier 126 between the free magnet 124, the fixed magnet 128.

FIG. 3A illustrates a spin orbit memory device 300 including the pMTJ 304 on the electrode 101, where a magnetization 129 of the free magnet 124 is aligned in a direction parallel to the magnetization 130 of the fixed magnet 128. In an embodiment, the direction of magnetization 129 of the free magnet 124 and the direction of magnetization 130 of the fixed magnet 128 are both in the negative Z-direction as illustrated in FIG. 3A. As discussed above, when the magnetization 129 of the free magnet 124 is in the same direction as a magnetization 130 of the fixed magnet 128, pMTJ 304, is in a low resistance state.

FIG. 3B illustrates the pMTJ 304 of the spin orbit memory device 300 switched to a high resistance state. In an embodiment, a reversal in the direction of magnetization 129 of the free magnet 124 in FIG. 3B relative to the direction of magnetization 129 of the free magnet 124 in FIG. 3A is brought about by (a) inducing a spin diffusion current 306 in the electrode 101 in the Y-direction, (by applying a positive voltage bias on terminal A with respect to a grounded terminal B), and (b) by an intrinsic or an extrinsic magnetic field 310, $H_y$, from magnetization in the spin orbit electrode 101 along the Y axis.

In an embodiment, a charge current 314 is passed through the electrode 101 in the negative y-direction. An electron current 318 flows in the positive y-direction. The electron current 318 includes electrons with two opposing spin orientations, a type I electron 322, having a spin oriented in the negative x-direction and a type II electron 326 having a spin oriented in the positive X-direction. In an embodiment, electrons in the electron current 318 experience a spin dependent scattering phenomenon in the electrode 101. The spin dependent scattering phenomenon is brought about by a spin-orbit interaction between the nucleus of the atoms in the electrode 101 and the electrons in the electron current 318. The spin dependent scattering phenomenon causes type I electrons 322, whose spins are oriented in the negative x-direction (into the page of FIG. 3B), to be deflected upwards towards an uppermost portion of the electrode 101 and type II electrons 326 whose spins are oriented in the positive X-direction to be deflected downwards towards a lowermost portion of the electrode 101. The separation between the type I electrons 322 and the type II electrons 326 induces a polarized spin diffusion current 306 in the electrode 101. In an embodiment, the polarized spin diffusion current 306 is directed upwards toward the free magnet 124 of the pMTJ 104, as is depicted in FIG. 3B. The polarized spin diffusion current 306 induces a spin Hall torque on the magnetization 129 of the free magnet 124. In an embodiment, a torque is also exerted on the magnetization 129 of the free magnet 124 by an intrinsic magnetic field, $H_y$, along the Y axis, as illustrated in FIG. 3B. In the illustrative embodiment, the intrinsic magnetic field, $H_y$, 310 provides a torque component (in the positive Z direction) to break symmetry and switch the magnetization 129 of the free magnet 124.

In a different embodiment, the torque due to the external magnetic field, $H_y$, can be supplemented by a torque from a spin torque transfer mechanism generated by passing a spin polarized current through the MTJ device 104 by voltage biasing terminal C. Terminal C may be biased relative to terminal B. In one example terminal B may be at some non-zero potential that is lower than a potential of A and C.

FIG. 3C illustrates the pMTJ 304 of the spin orbit memory device 300 switched to a low resistance state. In an embodiment, a reversal in the direction of magnetization 129 of the free magnet 124 in FIG. 3C compared to the direction of magnetization 129 of the free magnet 124 in FIG. 3B is brought about by (a) reversal in the direction of the spin diffusion current 306 in the electrode 101 (by applying a positive voltage bias on terminal B with respect to a grounded terminal A), and (b) by an intrinsic or extrinsic magnetic field 310, $H_y$, from magnetization in the spin orbit electrode 101 along the Y axis.

A read operation to determine a state of the MTJ device 104 may be performed by voltage biasing a third terminal C, connected to the fixed magnet 128 with respect to the either terminal and A and B, where the terminals A or B may be grounded during the read operation (not illustrated).

Figure 4:
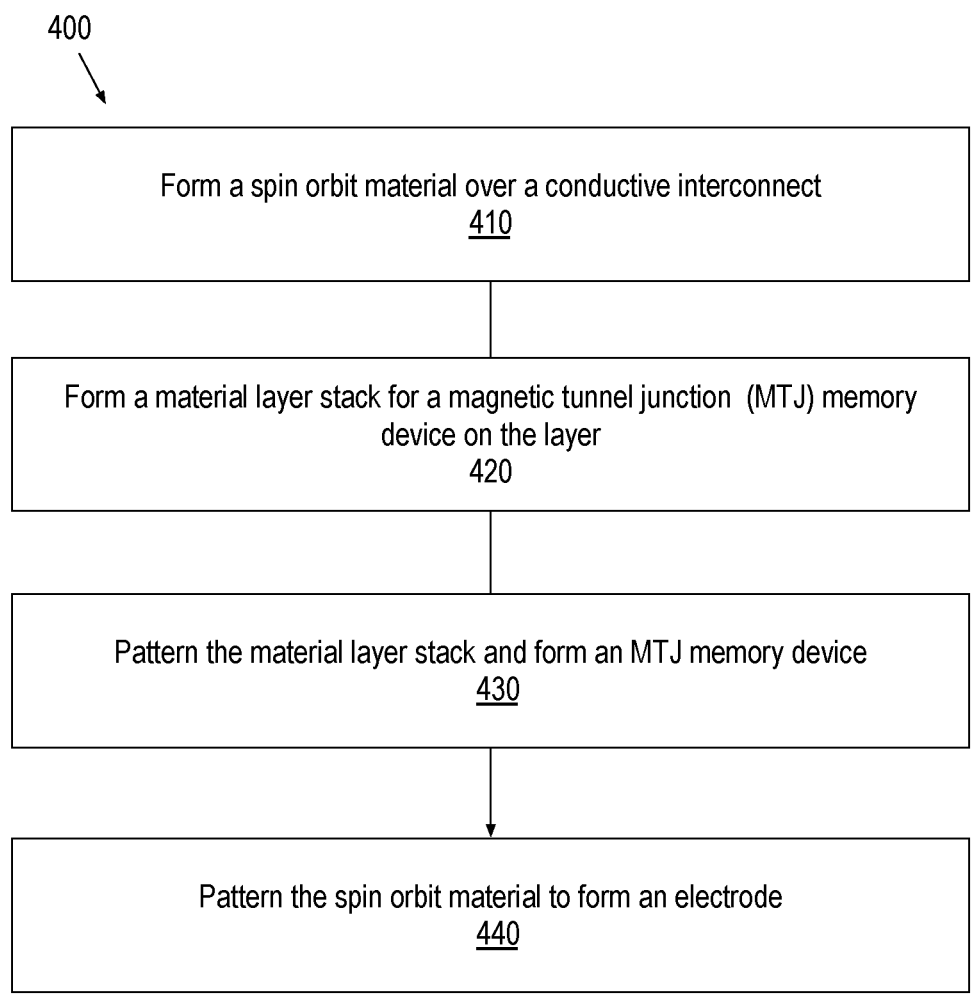
FIG. 4 illustrates a flow diagram for a method to fabricate a spin orbit memory device, in accordance with embodiments of the present disclosure.

FIG. 4 illustrates a flow diagram of a method to fabricate a spin orbit memory device such as a spin orbit memory device 100A. The method 400 begins at operation 410 by forming a spin orbit material on dielectric layer above a substrate. The method 400 continues at operation 420 with the deposition of a material layer stack for the formation of a spin orbit memory device. In exemplary embodiments, the spin orbit material and all layers in the material layer stack are blanket deposited in-situ without breaking vacuum. In a simplest embodiment, forming the material layer stack includes a deposition of a free magnetic layer on the spin orbit material, deposition of a tunnel barrier layer over the free magnetic layer, deposition of a fixed magnetic layer over the tunnel barrier layer. In an embodiment, the formation of the material layer stack further includes deposition of a plurality of layers of a synthetic antiferromagnetic (SAF) layer over the fixed magnetic layer, and deposition of a conductive material on the SAF layer. The method 400 continues at operation 430 with patterning of the material layer stack. The method 400 concludes at operation 440 by patterning the spin orbit material to form a spin orbit electrode.

FIGS. 5A-7 cross-sectional views of the spin orbit memory device 100 illustrated in FIG. 1A evolving as a fabrication method, such as method 400, is practiced.

Figure 5A:
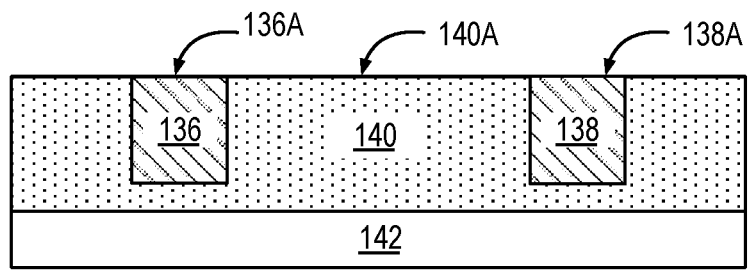
FIG. 5A illustrates a cross-sectional view following the formation of an electrode layer including a spin orbit material above a pair of conductive interconnects, in accordance with embodiments of the present disclosure.

FIG. 5A illustrates the structures of conductive interconnects 136 and 138 surrounded by a dielectric 140 formed above a substrate 142. In an embodiment, the conductive interconnects 136 and 138 are formed in a dielectric 140 by a damascene or a dual damascene process. In an embodiment, each of the conductive interconnects 136 and 138 include a barrier layer, such as titanium nitride, ruthenium, tantalum, tantalum nitride, and a fill metal, such as copper, tungsten. In an embodiment, the conductive interconnects 136 and 138 are fabricated using a subtractive etch process when materials other than copper are utilized. In one such embodiment, the conductive interconnects 136 and 138 include a material such as but not limited to titanium nitride, ruthenium, tantalum, tantalum nitride. In some examples, the dielectric 140 includes a material such as but not limited to silicon dioxide, silicon nitride, silicon carbide, or carbon doped silicon oxide. In an embodiment, the dielectric 140 has an uppermost surface 140A that is substantially co-planar with each of the uppermost surfaces 136A and 138A of the conductive interconnects 136 and 138, respectively. Depending on embodiments, the dielectric 140 has a total thickness between 70 nm and 120 nm. In some examples, at least one of the conductive interconnects 136 or 138 is electrically connected to a circuit element such as an access transistor (not shown). Logic devices such as access transistors may be integrated with memory devices such as a spin orbit device to form embedded memory.

Figure 5B:
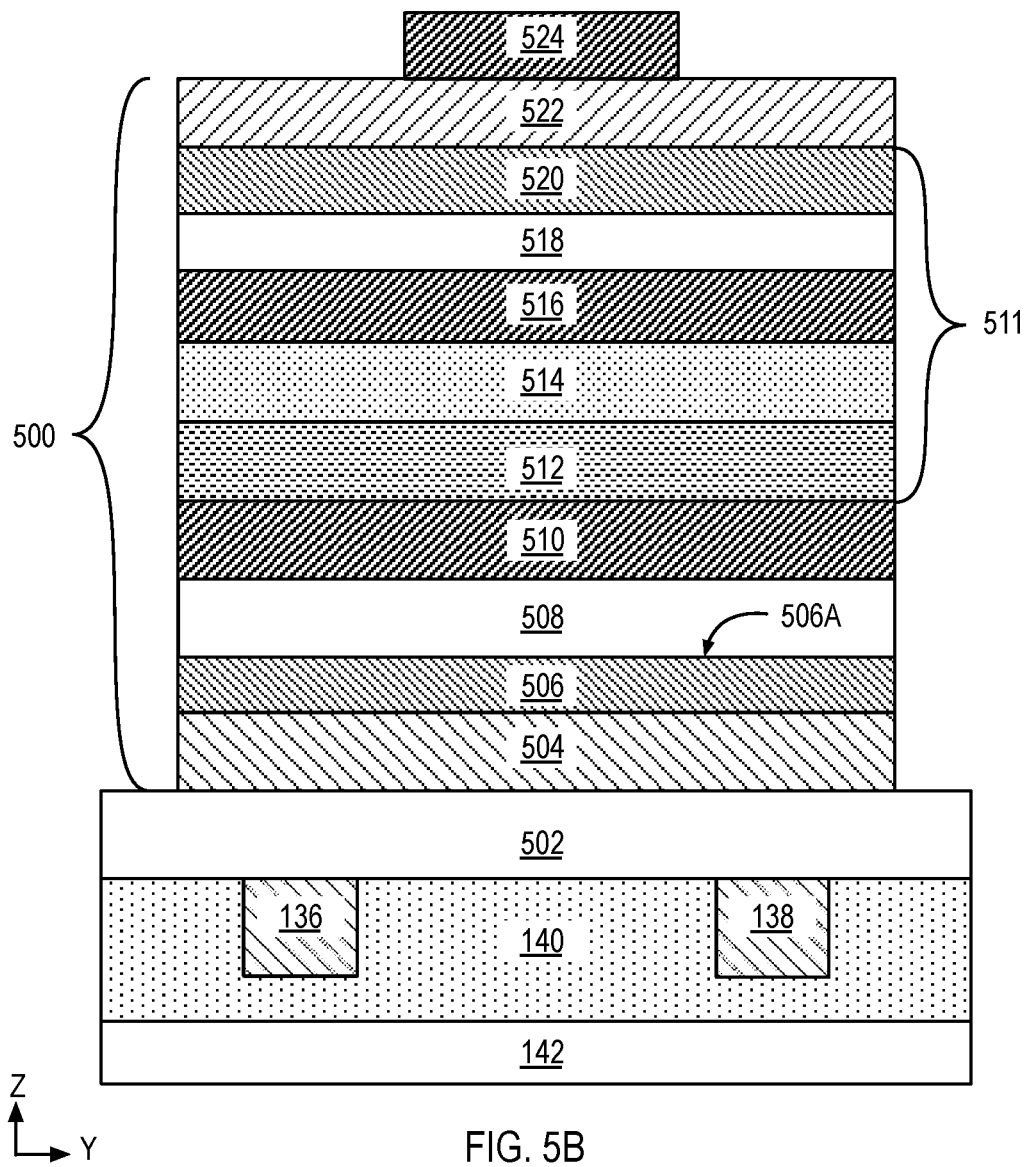
FIG. 5B illustrates a cross-sectional view of the structure in FIG. 5A following the formation of a material layer stack for a magnetic tunnel junction and an SAF structure on the conductive layer.

FIG. 5B illustrates a cross-sectional view of the structure in FIG. 5A following the formation the deposition of a layer 502 including a spin orbit material (herein spin orbit layer 502) on the conductive interconnects 136 and 138 and on the dielectric 140 and following the formation of a material layer stack 500 on the spin orbit layer 502.

In an embodiment, the spin orbit layer 502 is blanket deposited using a physical vapor deposition (PVD) or a chemical vapor deposition (CVD) process. In an embodiment, spin orbit layer 502 includes a spin orbit material such as tantalum, tungsten or alloys thereof, where the spin orbit material has a beta-phase cubic structure. In some embodiments, the spin orbit layer 502 is deposited to a thickness that is between 5 nm and 20 nm. In some embodiments, the as deposited thickness of the spin orbit layer 502 is greater than the final thickness of a spin orbit electrode to be formed as a fraction of the upper portion of the spin orbit layer 502 is removed during the fabrication process.

In some embodiments, a free magnet layer 504 is blanket deposited on the spin orbit layer 502. The free magnet layer 504 includes a material that is the same or substantially the same as the material of the free magnet 124. A tunnel barrier layer 506 is blanket deposited on the free magnet 504. In an embodiment, the tunnel barrier layer 506 includes magnesium and oxygen (for e.g. MgO) or aluminum and oxygen (for e.g. $Al_2O_3$). In an exemplary embodiment, the tunnel barrier layer 506 is an MgO and is deposited using a reactive sputter process. In an embodiment, the reactive sputter process is carried out at room temperature. In an embodiment, the tunnel barrier layer 506 is deposited to a thickness between 0.5 nm to 2 nm. In an embodiment, the deposition process is carried out in a manner that yields a tunnel barrier layer 506 having an amorphous structure. In some examples, the amorphous tunnel barrier layer 506 becomes crystalline after a high temperature anneal process to be described further below. In other embodiments, the tunnel barrier layer 506 is crystalline as deposited.

In an embodiment, a fixed magnet layer 508 is blanket deposited on a top surface 506A of the tunnel barrier layer 506. In an embodiment, the deposition process includes a physical vapor deposition (PVD) or a plasma enhanced chemical vapor deposition process. In an embodiment, the PVD deposition process includes an RF or a DC sputtering process. In an exemplary embodiment, the fixed magnet layer 508 is $Co_{100-x-y}Fe_xB_y$, where X and Y each represent atomic percent, further where X is between 50 and 80 and Y is between 10 and 40, and further where the sum of X and Y is less than 100. In some embodiments, the fixed magnet layer 508 includes a material that is the same or substantially the same as the material of the fixed magnet 128 described above. In some examples, the fixed magnet layer 508 may be deposited to a thickness between 0.6 nm and 2.0 nm.

The process is continued with deposition of a coupling layer 510. In some embodiments, a PVD process is utilized to deposit a single layer of a material such as tantalum. In other embodiments, coupling layer 510 is replaced by a multilayer stack. In an embodiment, multilayer stack includes layers of the multilayer stack 132, described in association with FIG. 1C. Referring again to FIG. 5B, in some such embodiment, formation of a multilayer stack utilizes sequentially depositing a layer of molybdenum on the fixed magnet layer 508, followed by depositing a magnetic layer on the layer of molybdenum, and capped by deposition of a layer of tantalum on the magnetic layer.

The process of forming the material layer stack 500 is continued with sequential blanket deposition of a plurality of layers utilized to form an SAF stack 511. In the illustrative embodiment, a magnetic layer 512 is deposited on the coupling layer 510, a layer 514 including a conductive material (herein conductive layer 514) is deposited on the magnetic layer 512 and magnetic layer 516 is deposited on the conductive layer 514. In an embodiment, the magnetic layers 512 and 516 include a material that is the same or substantially the same as the materials of the magnetic layer 108 and magnetic layer 112, respectively.

A non-magnetic layer 518 is then deposited on the magnetic layer 516. In an embodiment, the non-magnetic layer 518 includes a material that is the same or substantially the same as the material of the AFM coupling layer 114.

The deposition process to form an SAF stack 511 is concluded with deposition of one or more layers utilized to form a magnet structure 520 on the non-magnetic layer 518. In the illustrative embodiment, the deposition process of forming a magnet structure 520 involves forming a plurality of bilayers to such as the plurality of bilayers 117 capped by a magnetic layer 116C described in FIG. 1B. Referring again to FIG. 5B, in an embodiment, layers in the magnet structure 520 includes materials that are the same or substantially the same as the materials of the layers in the magnet structure 116.

In some embodiments, the process utilized to deposit all layers of the material layer stack 500, illustrated in FIG. 5B, is carried without an air break. The individual layers may be blanket deposited using a variety of deposition processes in a cluster tool. Some layers may be deposited using a physical vapor deposition (PVD) process, for example. Other layers, for example, may be deposited by processes that may include a co-sputter or a reactive sputtering process.

In an embodiment, the deposition process concludes with a blanket deposition of an electrode layer 522 on an uppermost surface of the magnet structure 520. The electrode layer 522 may act as a hardmask during etching of the material layer stack 500. In some examples, the electrode layer 522 includes an etch resistant material such as a metal such as Ta or an alloy such as TaN. In an embodiment, the thickness of the electrode layer 522 is between 5 nm and 70 nm. The thickness of the electrode layer 522 is chosen to accommodate patterning of the material layer stack 500, as well as to act as a top electrode for voltage biasing during operation.

In an embodiment, after all the layers in the pMTJ material layer stack 500 are deposited, an anneal is performed. In an embodiment, the anneal is performed immediately post deposition but before patterning of the pMTJ material layer stack 500. A post-deposition anneal of the pMTJ material layer stack 500 is carried out in a furnace in vacuum environment. In an embodiment, the anneal temperature ranges between 300 and 450 degrees Celsius.

In an embodiment, annealing process promotes solid phase epitaxy in the free magnet layer 504 and in the fixed magnet layer 508. In some embodiments, the free magnet layer 504 follows the bcc crystalline template of the tunnel barrier layer 506 (e.g., MgO) that is directly on the free magnet 504. In an embodiment, the anneal also promotes solid phase epitaxy of the fixed magnet layer 508 to follow a crystalline template of the tunnel barrier layer 506 (e.g., MgO) that is below and directly adjacent the fixed magnet layer 508. <001> Lattice matching between the tunnel barrier layer 506 and the free magnet layer 504 and <001> lattice matching between the tunnel barrier layer 506 and the fixed magnet layer 508 enables a TMR ratio of at least 100% to be obtained in the material layer stack 500.

In an embodiment, the annealing process is also performed in the presence of a magnetic field which sets a direction of magnetization in the fixed magnet layer 508 and magnetization in free magnet layer 504. In an embodiment, during the annealing process, an applied magnetic field that is directed perpendicular (along the Z axis) to a horizontal plane (the Y axis) of material layer stack 500 enables a perpendicular anisotropy to be set in the fixed magnet layer 508 and in the free magnet layer 504. The applied magnetic field also sets magnetization in the layers in the SAF stack 511. The presence of an antiferromagnetic coupling material in the non-magnetic layer 518 enables antiferromagnetic coupling between the magnet structure 520 and the combined layers 508, 512 and 516.

After the material layer stack 500 has been annealed, a measurement of the resistance of the material layer stack 500 is measured as a function of an externally applied field to determine if the layers deposited to form an SAF stack 511 have desirable magnetic properties. A description of the relationship between resistance and external magnetic field will be described further below.

A mask 524 may be formed on the material layer stack 500 after the material layer stack 500 has been annealed. In some embodiments, the mask 524 is formed by a lithographic process. In other embodiments, the mask 524 includes depositing and patterning a dielectric material on the material layer stack 500. The mask 524 defines a shape and size of a pMTJ and a location where the pMTJ is to be subsequently formed relative to the conductive interconnects 136 and 138. In some embodiments, the mask 524 has a circular plan view shape as is depicted in the plan view illustration of FIG. 1B. Referring again to FIG. 5B, the mask 524 is formed on a plane above, but laterally between from the conductive interconnects 136 and 138. The mask 524 may, for example, be formed approximately, midway between conductive interconnects 136 and 138.

Figure 5C:
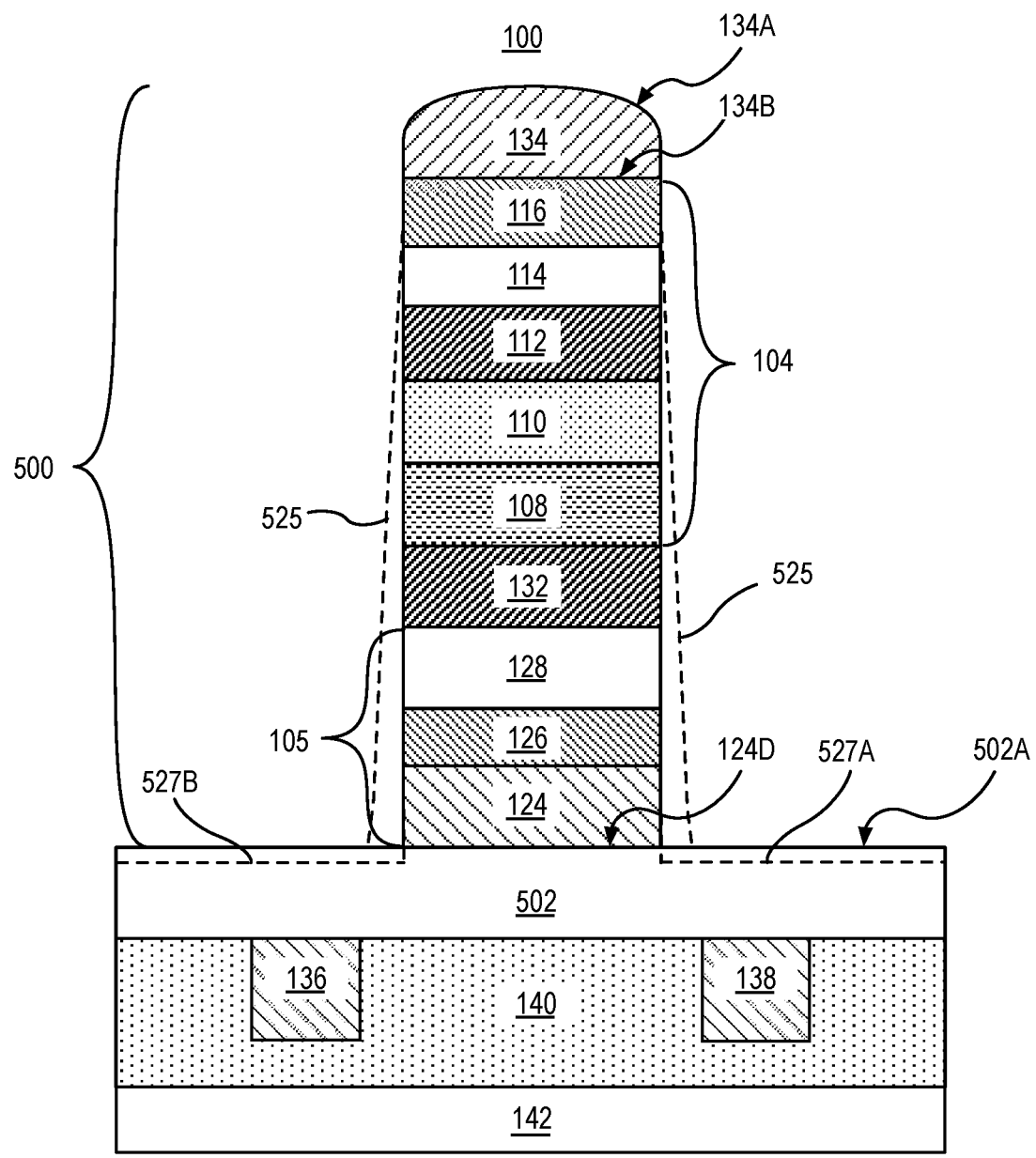
FIG. 5C illustrates a cross-sectional view of the structure in FIG. 5B following the process of etching the material layer stack.

FIG. 5C illustrates a cross-sectional view of the structure in FIG. 5B following patterning and etching of the material layer stack 500. In an embodiment, the patterning process first includes etching the electrode layer 522 by a plasma etch process to form a top electrode 134. In an embodiment, plasma etch process possesses sufficient ion energy and chemical reactivity to render vertical etched sidewalls of the top electrode 134. In an embodiment, the plasma etch process is then continued to pattern the remaining layers of the material layer stack 500. The plasma etch process etches the various layers in the material layer stack 500 to form top electrode 134, an SAF structure 104, a spacer layer 132 and pMTJ 105.

In some embodiments, depending on plasma etch parameters (ion energy, density, electron temperature, reacting species etc.), the patterned material layer stack 102 may have sidewalls that are tapered during the etching process. A taper in sidewalls of patterned material layer stack 102 is indicated by the dashed lines 525.

In the illustrative embodiment, the material layer stack 500 that has been patterned has substantially vertical profiles. As such, the magnet structure 116, the AFM coupling layer 114, the magnetic layer 112, conductive layer 110, magnetic layer 108, spacer layer 132, fixed magnet 128, tunnel barrier layer 126 and free magnet 124 have sidewalls that are substantially vertical.

In other embodiments, depending on the etch selectivity between the material free magnet 124 and the material of the spin orbit layer 502, the spin orbit layer surface 502A may be recessed during patterning of the material layer stack 505. For example, spin orbit layer surface 502A may be recessed below the lowermost free magnet surface 124D as indicated by the dashed lines 527A and 527B. The recess may be between 1 nm-3 nm. The recess across the spin orbit layer 502 may not be uniform. In some such embodiments, the dashed lines 527A and 527B may not be at a same level with respect to the spin orbit layer surface 502A.

Depending on the material of the top electrode 134, a top surface 134A of the top electrode 134 may be eroded non-uniformly relative to a lowermost surface 134B. A substantially curved top surface 134A may form in some examples, such as in the example illustrated in FIG. 5C.

Figure 5D:
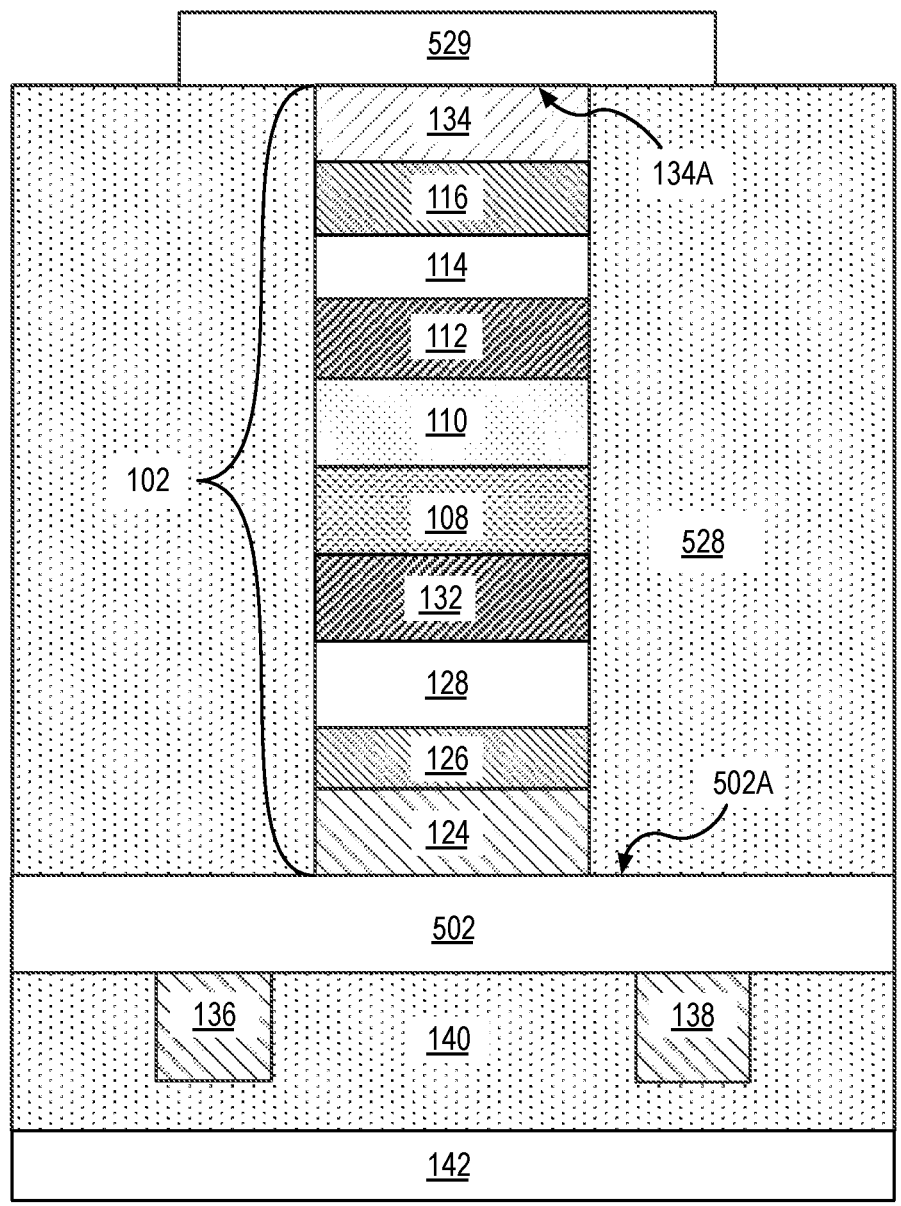
FIG. 5D illustrates a cross-sectional view of the structure in FIG. 5C following the deposition of a dielectric layer on the MTJ device and planarization of a first dielectric material, followed by the formation of a mask.

FIG. 5D illustrates a cross-sectional view of the structure in FIG. 5C following the deposition of a dielectric 528 on the MTJ device and planarization of the dielectric 528, followed by the formation of a mask 529 on the patterned material layer stack 102 and on a portion of the dielectric 528. The dielectric 528 is also formed directly adjacent to material layer stack 102 on an uppermost surface 502A of the spin orbit layer 502. In an embodiment, the dielectric 528 includes a material that is the same or substantially the same as the material of the dielectric 140.

A planarization process is carried out, for example, to remove an excess dielectric 528 from above the material layer stack 102. The planarization process is continued until all of the dielectric 528 is removed from above the top electrode 134. Portions of the dielectric 528 remain adjacent to the material layer stack 102 after the planarization process. In an embodiment, after the planarization process, a substantially curved top surface 134A (illustrated in FIG. 5C) may be fully or partially planarized. A substantially flat top surface 134A is illustrated in FIG. 5D.

In some embodiments, the mask 529 is formed by a lithographic process. In other embodiments, the mask 529 includes depositing and patterning a dielectric material on the material layer stack 102 and on portions of the dielectric 528. The mask 529 defines an electrode that will subsequently be formed.

Figure 6A:
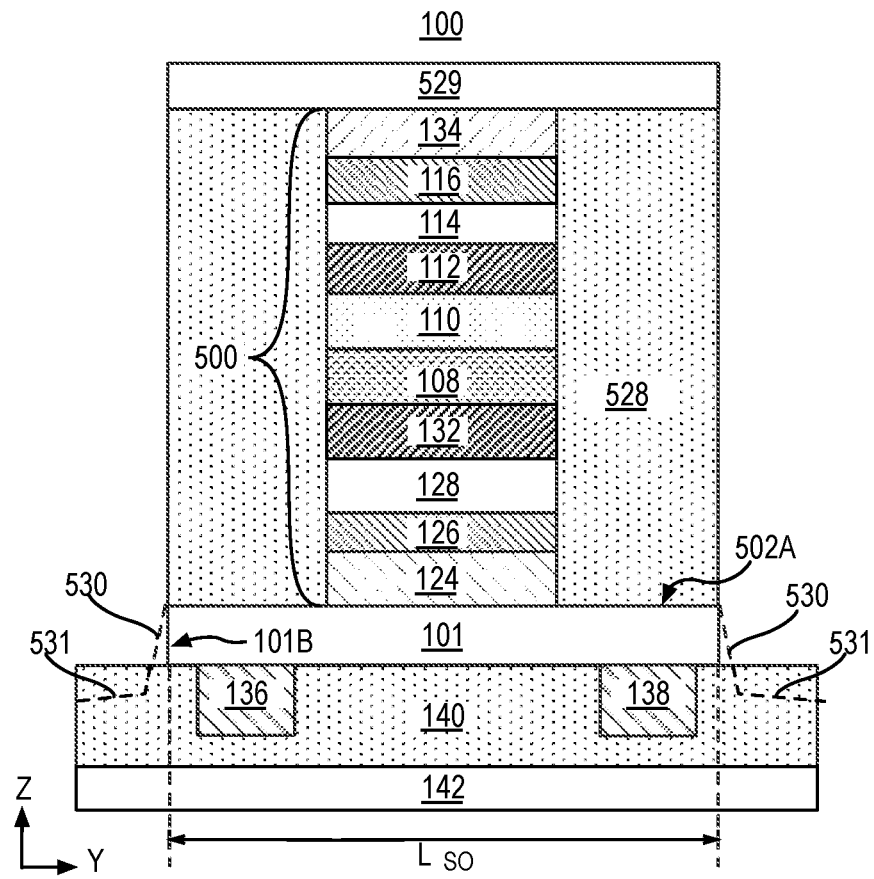
FIG. 6A illustrates a cross-sectional view of the structure in FIG. 5D following the process of etching the first dielectric material exposed by the mask and following etching of the electrode layer to form a spin orbit electrode.

FIG. 6A illustrates a cross-sectional view of the structure in FIG. 5D following the process of etching the dielectric 528 uncovered by the mask 529 and following etching portions of the spin orbit layer 502 to form a spin orbit electrode 101.

In an embodiment, a plasma etch process is utilized to pattern the dielectric 528 and expose an uppermost surface 502A. The patterning processing is continued to form spin orbit electrode 101. In an embodiment, the spin orbit electrode 101 is formed by a utilizing a plasma etch process to selectively etch the spin orbit layer with respect to the mask 529 and to the dielectric 528. In other embodiments, the spin orbit layer is patterned by an ion milling process selectively to the mask 529 and the dielectric 528 after the dielectric material has been etched.

Depending on the process utilized to form the spin orbit electrode 101, the sidewall 101B of the spin orbit electrode 101 may be vertical in some examples, such as is illustrated. In other examples sidewall 101B may be tapered (as indicated by dashed lines 530). Furthermore, the dielectric 140 may also be eroded (as indicated by dashed lines 531) in a non-uniform manner depending on the patterning process utilized.

The size and shape of the spin orbit electrode 101 depends on the size and shape of mask 529. In some embodiments, the spin orbit electrode 101 has a shape and size as depicted in FIG. 1B.

Figure 6B:
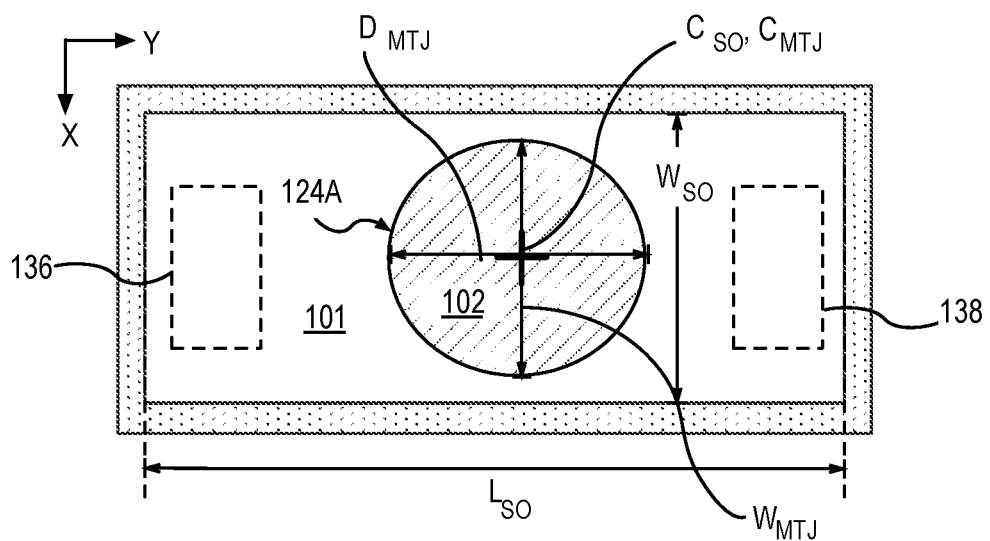
FIG. 6B illustrates a plan view of a portion of the structure in FIG. 6A, depicting a plan view shape and size of the material layer stack relative to the spin orbit electrode, in accordance with an embodiment of the present disclosure.

In other examples, the spin orbit electrode 101 may have dimensions that extend beyond material layer stack 102 as illustrated in the plan view illustration of FIG. 6B. For example, a width $W_{SO}$, of the spin orbit electrode 101 may be larger than a width, $W_{MTJ}$, as shown. The material layer stack 102 has a circular plan view profile, as shown. A length $L_{SO}$, of the spin orbit electrode 101 is larger than a diameter, $D_{MTJ}$, as shown. In some examples, the centers $C_{MTJ}$ and $C_{SO}$ may be aligned, such as is shown. The mask 529 and the dielectric 528 are not shown in the plan view illustration to clarify the size and location of the material layer stack 102 relative to the spin orbit electrode 101.

Outlines of the conductive interconnects 136 and 138 are also illustrated in the plan view illustration. The conductive interconnects 136 and 138 are confined within a plan view area of the spin orbit electrode 101.

Figure 7:
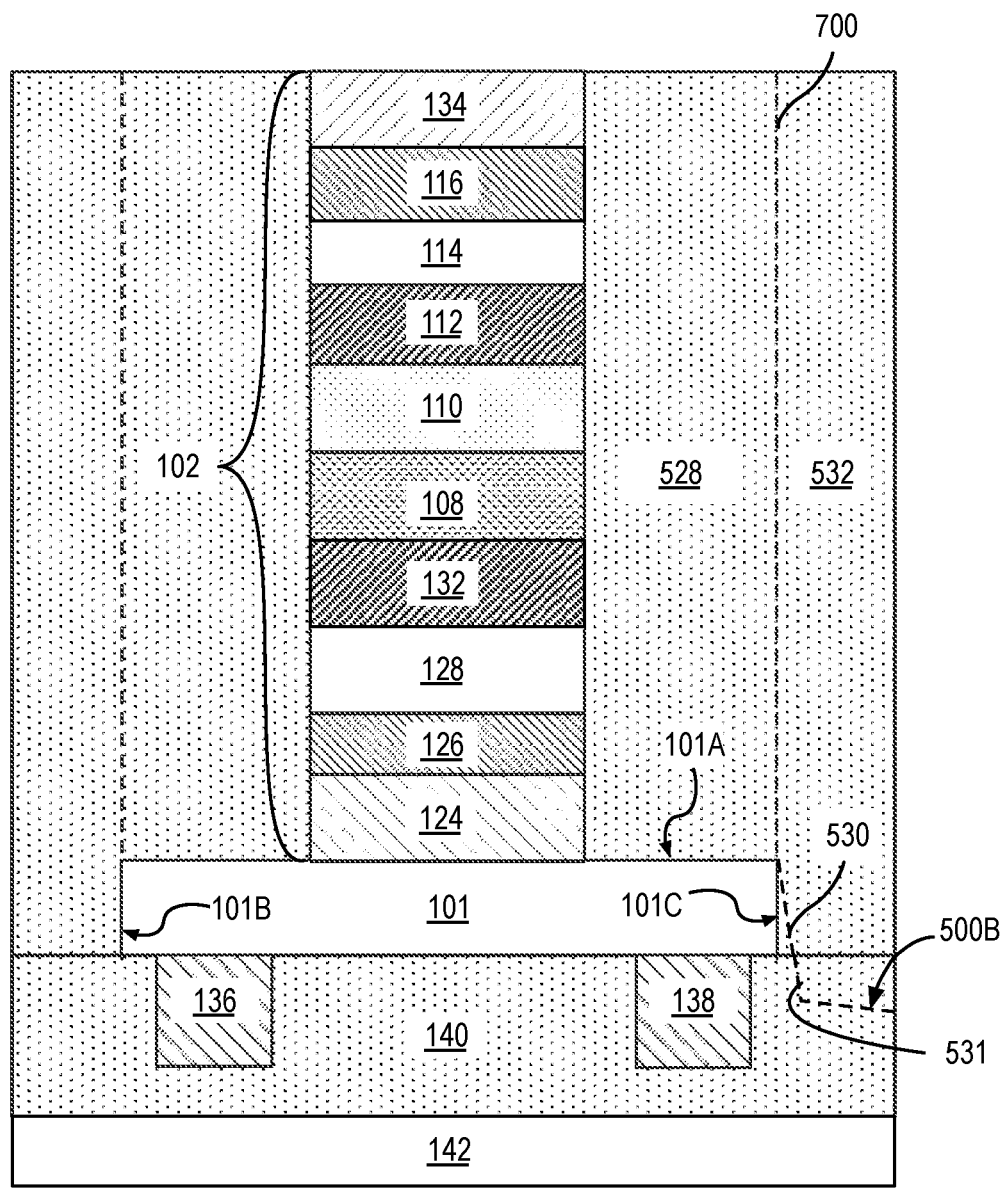
FIG. 7 illustrates the structure of FIG. 6A following the formation of a second dielectric material adjacent to the spin orbit electrode and the first dielectric material.

FIG. 7 illustrates the structure of FIG. 6A following the formation of a dielectric 532 adjacent to sidewalls 101B of the spin orbit electrode 101. In the illustrative embodiment, the dielectric 532 is also deposited on the dielectric 140 and adjacent to the dielectric 528 as shown. Dashed lines 700 defines an interface between the dielectric 528 and dielectric 532.

In some examples, where dielectric material 140 is recessed (dashed line 531) and the spin orbit electrode 101 has tapered sidewalls 10B and 101C (dashed line 529) the dielectric material 532 is adjacent to tapered sidewalls 101B and on a recessed dielectric surface 140B.

The material layer stack 102 formed on spin orbit electrode 101 and coupled with conductive interconnects 136 and 138 through the spin orbit electrode 101, constitutes a perpendicular spin orbit memory device 100, described in association with FIG. 1A.

In other embodiments, a dielectric spacer layer may be formed adjacent to the material layer stack 102. The dielectric spacer layer may be formed in situ following formation of the patterned material layer stack 102. An in-situ deposition of a dielectric spacer layer may help prevent oxidation of one or more layers of the patterned material layer stack 102.

Figure 8:
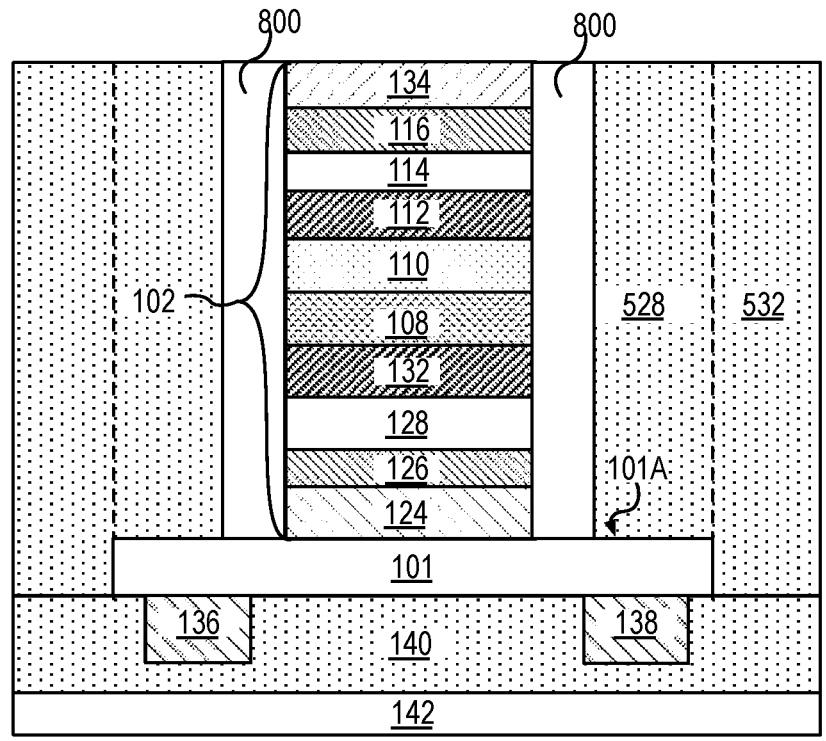
FIG. 8 illustrates the structure of FIG. 7 having a dielectric spacer adjacent to the material layer stack.

FIG. 8 is a cross sectional illustration of the structure in FIG. 5C following the formation of a dielectric spacer 800 adjacent to the material layer stack 102, following deposition of dielectric 528, following patterning of the dielectric 528 and following the formation of spin orbit electrode 101.

In an embodiment, dielectric spacer 800 is formed by depositing a dielectric spacer layer on sidewalls of material layer stack 102 and on the spin orbit layer 502. In an embodiment, the dielectric material includes silicon and nitrogen and/or carbon. The dielectric spacer layer is patterned such that spacer material remains adjacent to sidewalls of material layer stack 102. The remaining process operations including deposition of dielectric 528, patterning of dielectric 528, formation of spin orbit electrode 101 and formation of dielectric 532 are similar to the operations described above in association with FIGS. 5D, 6A and 7.

Figure 9:
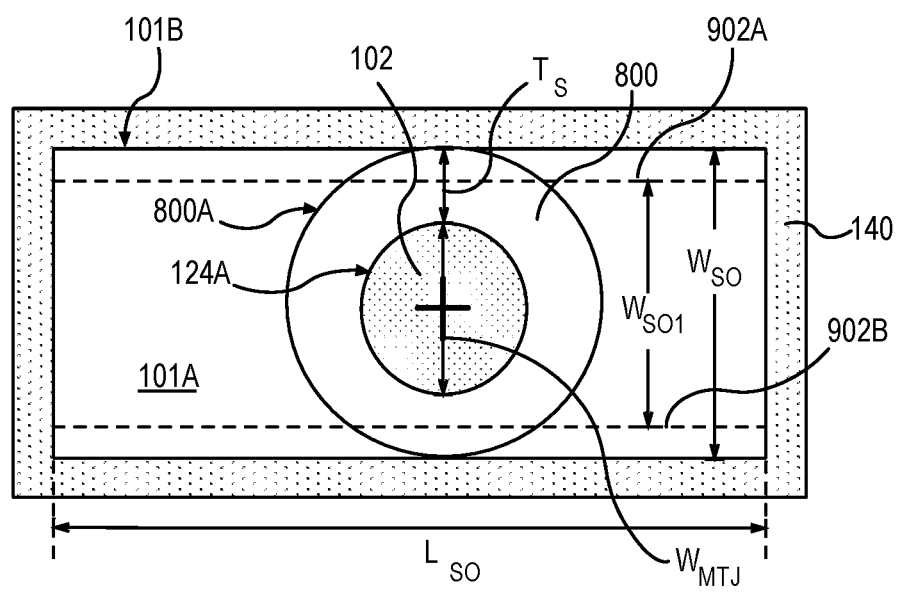
FIG. 9 illustrates a plan view of the structure in FIG. 8, in an absence of the first and second dielectric materials.

FIG. 9 illustrates a plan view of the dielectric spacer 800 formed adjacent to the material layer stack 102. The mask 529 and the dielectric 528 and dielectric 532 are not shown in the plan view illustration of FIG. 9 to clarify the size and location of the material layer stack 102 and dielectric spacer 800 relative to the spin orbit electrode 101. In the illustrative embodiment, the spin orbit electrode 101 has a width, $W_{SO}$, (along the X—axis) that is equal to a sum of the width, $W_{MTJ}$, of the material layer stack 102 (along the X—axis) and two times a thickness, $T_S$, of the dielectric spacer 800 as shown. In other examples (not illustrated), the spin orbit electrode 101 has a width, $W_{SO}$, that is greater than a sum of the width, $W_{MTJ}$, of the material layer stack 102 and two times the thickness, $T_S$. The thickness, $T_S$ may range between 10 nm and 30 nm.

In some embodiments, the spin orbit electrode 101 has a width, $W_{SO1}$, that is less than a sum of the width, $W_{MTJ}$, of the material layer stack 102 plus two times the thickness, $T_S$. The pair of dashed lines 902A and 902B illustrate the width, $W_{SO1}$. In some such embodiment, portions of the dielectric spacer 800 above line 902A and below line 902B may be removed during formation of the spin orbit electrode 101.

Figure 10:
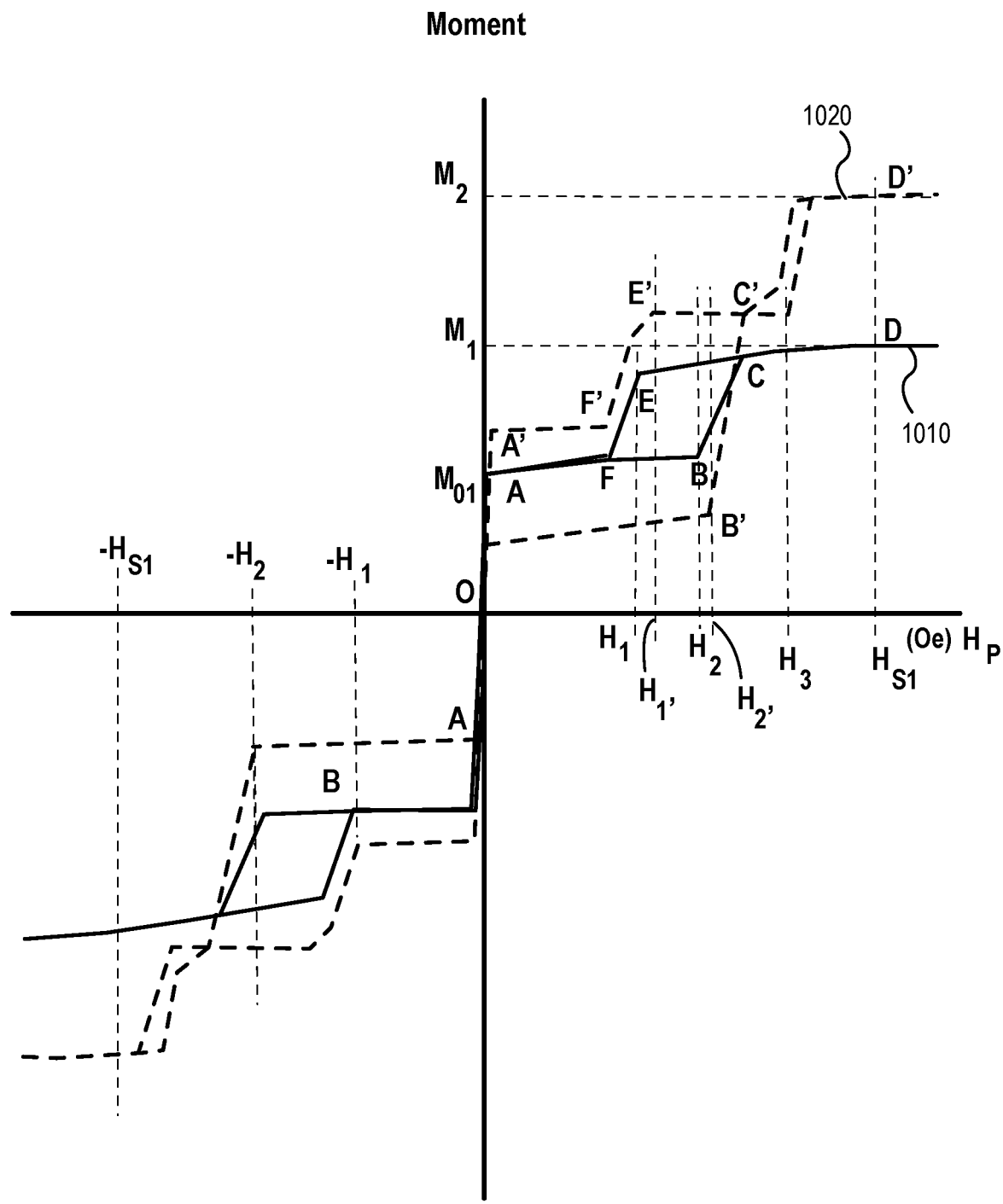
FIG. 10 illustrates a plot of the total magnetic moment versus an externally applied magnetic field, H for a material layer stack for a spin orbit memory device.

FIG. 10 illustrates a plot (line 1010) of the total magnetic moment of a memory device such as memory device 100 including an SAF structure 104 (depicted in FIG. 1A) versus an externally applied magnetic field, H. The total magnetic moment of a memory device where an SAF structure 104 includes a magnet structure 106 (having a plurality of stacked magnetic and non-magnetic layers including platinum), is also plotted in FIG. 10 (denoted by line 1020). The memory device where an SAF structure 104 includes a magnet structure 106 (having a plurality of stacked magnetic and non-magnetic layers including platinum) is herein referred to as multilayer SAF memory device.

As illustrated, the total magnetic moment, $M_1$ of memory device 100 including SAF structure 104 is less than a total magnetic moment, $M_2$ of the multilayer SAF memory device. In an embodiment, $M_1$ is lower than $M_2$ by as much as 33%. $M_1$ and $M_2$ are measured at saturation field $H_{S1}$ (greater than 3K Oe for example). At saturation magnetic field all magnets are aligned in the direction of the externally applied magnetic field, H.

For memory device 100, as the applied magnetic field is increased in magnitude from 0 Oe to saturation field ($H_{S1}$ Oe), the magnetization behavior is given by line 1010 in the plot. The total magnetic moment increases sharply just after applying a nominal field (from O to point A). The total magnetic moment at point A is approximately $M_{O1}$ until the field is increased to $H_2$. When the applied magnetic field reaches $H_2$ (point B), the reference layer undergoes switching and the total magnetic moment approaches $M_1$ but does not equal $M_1$. Switching is indicated by a rapid transition from point B to point C. As the applied magnetic field is further increased to $H_{S1}$ at point D, the total magnetic moment saturates at a value $M_1$. As the magnetic field is reduced in magnitude from point D towards C, there is gradual reduction in magnetic moment until point E. At point E, the reference layer undergoes switching at an externally applied field $H_1$. Switching is indicated by a rapid transition from point E to point F. The total magnetic moment reduces to a level substantially closer to $M_{O1}$ at point F. When the field is reduced further, the total magnetic moment reduces to $M_{O1}$ at point A. When the field is reduced further to 0 Oe, the free layer switches. When the direction of the externally applied magnetic field is reversed, the switching behavior is shown on the left side of the Moment axis. The switching behavior and magnetic moments is substantially similar as described above.

In the case of a multilayer SAF memory device, the overall switching behavior is substantially similar to the switching behavior of the reference layer in memory device 100. In the multilayer SAF memory device (denoted by line 1020), as the applied magnetic field is increased in magnitude from 0 Oe to $H_{S1}$ Oe, the total magnetic moment increases sharply just after applying a nominal field (point A'). This corresponds to free magnets undergoing switching in the multilayer SAF memory device. When the applied magnetic field reaches $H_{2'}$ (at point B') all reference layer(s) undergo switching. Switching is indicated by a rapid transition from point B' to point C'. The magnitude of the externally applied field $H_{2'}$ at which switching occurs is substantially similar to magnitude of the externally applied field $H_2$ for memory device 100 despite the difference in the SAF structure between the two memory devices.

At C', the total magnetic moment approaches a value greater than $M_1$ but less than $M_2$. As the applied magnetic field is further increased to $H_{S1}$ at point D', the total magnetic moment saturates at a value of approximately $M_2$. At $H_{S1}$ $M_2$ is approximately 50% greater than $M_1$.

As the externally applied magnetic field is reduced in magnitude from point D' towards E', there is reduction in magnetic moment at point C' and further reduction as E' is reached. At point E', the reference layer undergoes switching at an externally applied field Hr. Switching is indicated by a rapid transition from point E' to point F'. The total magnetic moment reduces to a level substantially above $M_{O1}$ at point F'. The magnitude of the externally applied field $H_{1'}$ at which switching occurs is substantially similar to magnitude of the externally applied field $H_1$ for memory device 100 despite the difference in the SAF structure between the two memory devices.

When the field is reduced further, the total magnetic moment reduces to $M_{01}$ at point A. When the field is reduced further to 0 Oe, the free layer in the multilayer SAF memory device switches. When the direction of the externally applied magnetic field is reversed, the switching behavior is shown on the left side of the Moment axis. The switching behavior and magnetic moments is substantially symmetric about the directions of the externally applied fields.

From an operational perspective, fields $H_1$ and $H_2$ are substantially similar to fields $H_{1'}$ and $H_{2'}$, respectively. From a device perspective, the $M_2$ is approximately 50% greater than $M_1$ or that $M_1$ is lower than $M_2$ by as much as 33%.

Figure 11:
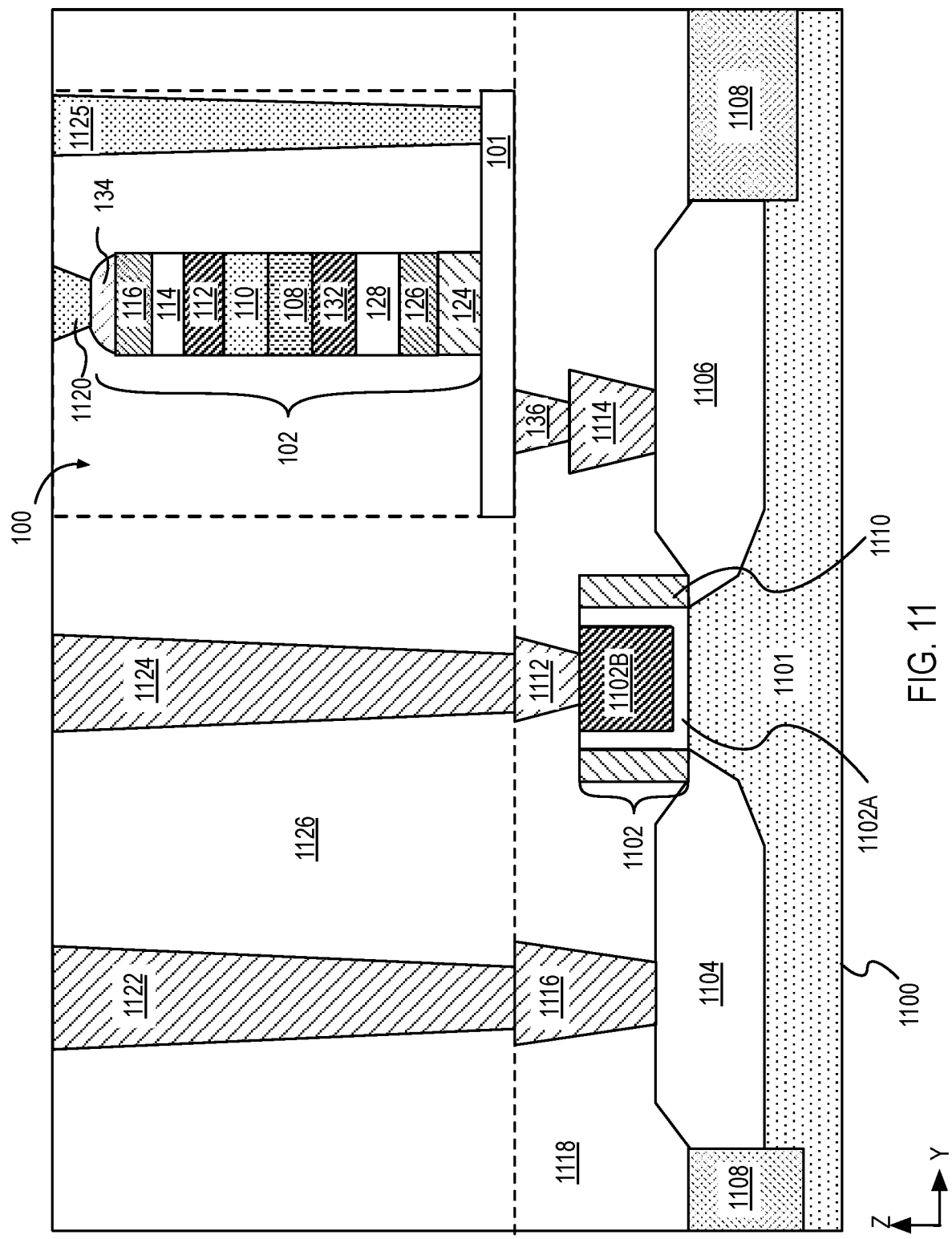
FIG. 11 illustrates a cross-sectional view of a spin orbit memory device coupled having one terminal coupled to a transistor.

FIG. 11 illustrates a two-terminal spin orbit memory device such as spin orbit memory device 100 coupled to an access transistor 1100.

In an embodiment, the transistor 1100 is on a substrate 1101 and has a gate 1102, a source region 1104, and a drain region 1106. In the illustrative embodiment, an isolation 1108 is adjacent to the source region 1104, drain region 1106 and portions of the substrate 1101. In some implementations of the disclosure, such as is shown, a pair of sidewall spacers 1110 are on opposing sides of the gate 1102.

The transistor 1100 further includes a gate contact 1112 above and electrically coupled to the gate 1102, and a drain contact 1114 above and electrically coupled to the drain region 1106, and a source contact 1116 above and electrically coupled to the source region 1104, as is illustrated in FIG. 11. The transistor 1100 also includes dielectric 1118 adjacent to the gate 1102, source region 1104, drain region 1106, isolation 1108, sidewall spacers 1110, gate contact 1112, drain contact 1114 and source contact 1116.

In an embodiment, the spin orbit memory device 100 is a perpendicular spin orbit memory device 100 with one or more structural and material properties described above in FIG. 1A. The spin orbit memory device 100 includes spin orbit 101 and material layer stack 102 on a portion of the spin orbit electrode 101. The material layer stack 102 includes magnet 124 on the spin orbit electrode 101, tunnel barrier 126, magnet 128 on the tunnel barrier 126, spacer layer 132 on the magnet 128, magnetic layer 108 on the spacer layer 132, conductive layer 110 on the magnetic layer 108, magnetic layer 112 on the conductive layer 110, AFM coupling layer 114 on magnetic layer 112, magnet structure 116 on the AFM coupling layer and electrode 134 on the magnet structure 116.

An MTJ interconnect 1120, is coupled with the electrode 134 as shown. MTJ interconnect 1120 may be connected to one or more circuit elements. The spin orbit electrode 101 is above and coupled with conductive interconnect 136 and adjacent to dielectric 1118. The material layer stack 102 is laterally between the conductive interconnect 136 and a spin orbit interconnect 1125. The spin orbit interconnect 1125 may be connected to a circuit element such as a terminal of an additional transistor.

In the illustrative embodiment, the conductive interconnect 112 is on and above with the drain contact 1114. In the illustrative embodiment, one portion of the spin orbit electrode 101 is in electrical contact with a drain contact 1114 of transistor 1100 through the conductive interconnect 136. In other embodiments, there are one or more additional interconnect structures between drain contact 1114 and conductive interconnect 136.

In other embodiments, a perpendicular spin orbit memory device such as perpendicular spin orbit memory device having one or more features of spin orbit memory device 200 (described in FIG. 2) may be coupled with the transistor 1100.

Gate contact 1112 and source contact 1116 are each coupled with interconnects. In the illustrative embodiment, gate contact 1112 is coupled with a source interconnect 1122 and the source contact 1116 is coupled with a gate interconnect 1124. A dielectric 1126 is adjacent to source interconnect 1122, gate interconnect 1124, memory device 100, source contact 1116 and gate contact 1112.

In an embodiment, the underlying substrate 1101 represents a surface used to manufacture integrated circuits. Suitable substrate 1101 includes a material such as single crystal silicon, polycrystalline silicon and silicon on insulator (SOI), as well as substrates formed of other semiconductor materials. In some embodiments, the substrate 1101 is the same as or substantially the same as the substrate 116. The substrate 1101 may also include semiconductor materials, metals, dielectrics, dopants, and other materials commonly found in semiconductor substrates.

In an embodiment, the transistor 1100 associated with substrate 1101 are metal-oxide-semiconductor field-effect transistors (MOSFET or simply MOS transistors), fabricated on the substrate 1101. In some embodiments, the transistor 1100 is an access transistor 1100. In various implementations of the disclosure, the transistor 1100 may be planar transistors, nonplanar transistors, or a combination of both. Nonplanar transistors include FinFET transistors such as double-gate transistors and tri-gate transistors, and wrap-around or all-around gate transistors such as nanori16on and nanowire transistors.

In some embodiments, gate 1102 includes at least two layers, a gate dielectric layer 1102A and a gate electrode 1102B. The gate dielectric layer 1102A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 1102A to improve its quality when a high-k material is used.

The gate electrode 1102B of the access transistor 1100 of substrate 1101 is formed on the gate dielectric layer 1102A and may consist of at least one P-type work function metal or N-type work function metal, depending on whether the transistor is to be a PMOS or an NMOS transistor. In some implementations, the gate electrode 1102B may consist of a stack of two or more metal layers, where one or more metal layers are work function metal layers and at least one metal layer is a conductive fill layer.

For a PMOS transistor, metals that may be used for the gate electrode 1102B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.11 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.11 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 1102B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 1102B may consist of one or more U-shaped metal layers formed atop one or more planar, non-U-shaped layers.

The sidewall spacers 1110 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 1104 and drain region 1106 are formed within the substrate adjacent to the gate stack of each MOS transistor. The source region 1104 and drain region 1106 are generally formed using either an implantation/diffusion process or an etching/deposition process. In the former process, dopants such as boron, aluminum, antimony, phosphorous, or arsenic may be ion-implanted into the substrate to form the source region 1104 and drain region 1106. An annealing process that activates the dopants and causes them to diffuse further into the substrate typically follows the ion implantation process. In the latter process, the substrate 1101 may first be etched to form recesses at the locations of the source and drain regions. An epitaxial deposition process may then be carried out to fill the recesses with material that is used to fabricate the source region 1104 and drain region 1106. In some implementations, the source region 1104 and drain region 1106 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 1104 and drain region 1106 may be formed using one or more alternate semiconductor materials such as germanium or a group III-V material or alloy. And in further embodiments, one or more layers of metal and/or metal alloys may be used to form the source region 1104 and drain region 1106.

In an embodiment, the source contact 1116, the drain contact 1114 and gate contact 1112 each include a multi-layer stack. In an embodiment, the multi-layer stack includes two or more distinct layers of metal such as a layer of Ti, Ru or Al and a conductive cap on the layer of metal. The conductive cap may include a material such as W or Cu.

In an embodiment, the source interconnect 1122 gate interconnect 1124, spin orbit interconnect 1125 and MTJ interconnect 1120 includes a material that is the same or substantially the same as the material of the conductive interconnect 136.

The isolation 1108 and dielectric 1118 and 1126 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 12:
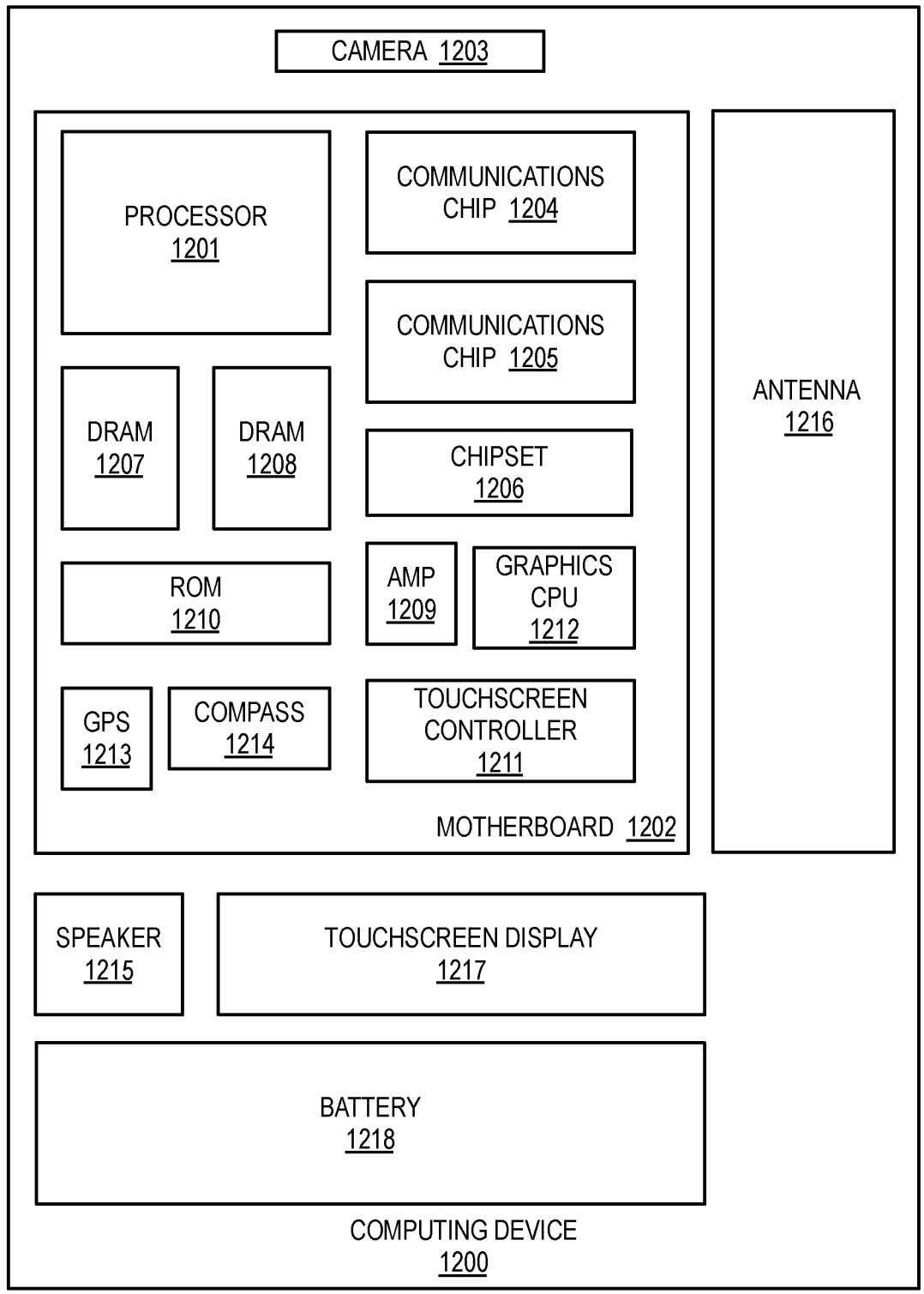
FIG. 12 illustrates a computing device in accordance with embodiments of the present disclosure.

FIG. 12 illustrates a computing device 1200 in accordance with embodiments of the present disclosure. As shown, computing device 1200 houses a motherboard 1202. Motherboard 1202 may include a number of components, including but not limited to a processor 1201 and at least one communications chip 1204 or 1205. Processor 1201 is physically and electrically coupled to the motherboard 1202. In some implementations, communications chip 1205 is also physically and electrically coupled to motherboard 1202. In further implementations, communications chip 1205 is part of processor 1201.

Depending on its applications, computing device 1200 may include other components that may or may not be physically and electrically coupled to motherboard 1202. These other components include, but are not limited to, volatile memory (e.g., DRAM), non-volatile memory (e.g., ROM), flash memory, a graphics processor, a digital signal processor, a crypto processor, a chipset 1206, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 1205 enables wireless communications for the transfer of data to and from computing device 1200. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 1205 may implement any of a number of wireless standards or protocols, including but not limited to Wi-Fi (IEEE 802.11 family), WiMAX (IEEE 802.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 1200 may include a plurality of communications chips 1204 and 1205. For instance, a first communications chip 1205 may be dedicated to shorter range wireless communications such as Wi-Fi and Bluetooth and a second communications chip 1204 may be dedicated to longer range wireless communications such as GPS, EDGE, GPRS, CDMA, WiMAX, LTE, Ev-DO, and others.

Processor 1201 of the computing device 1200 includes an integrated circuit die packaged within processor 1201. In some embodiments, the integrated circuit die of processor 1001 includes one or more transistors, interconnect structures, and non-volatile memory devices such as transistor 1100 source interconnect 1112, gate interconnect 1114, spin orbit interconnect 1125, MTJ interconnect 1120, conductive interconnect 136 and memory device 100, respectively (described in FIG. 11). The term "processor" may refer to any device or portion of a device that processes electronic data from registers and/or memory to transform that electronic data into other electronic data that may be stored in registers and/or memory.

Communications chip 1205 also includes an integrated circuit die packaged within communication chip 1205. In another embodiment, the integrated circuit die of communications chips 1204, 1205 includes one or more transistors, interconnect structures, and non-volatile memory devices such as transistor 1100, source interconnect 1122, gate interconnect 1112, spin orbit interconnect 1125, MTJ interconnect 1120, conductive interconnect 136 and memory device 100, respectively (described in FIG. 11). Depending on its applications, computing device 1200 may include other components that may or may not be physically and electrically coupled to motherboard 1202. These other components may include, but are not limited to, volatile memory (e.g., DRAM) 1207, 1208, non-volatile memory (e.g., ROM) 1210, a graphics CPU 1212, flash memory, global positioning system (GPS) device 1213, compass 1214, a chipset 1206, an antenna 1216, a power amplifier 1209, a touchscreen controller 1211, a touchscreen display 1217, a speaker 1215, a camera 1203, and a battery 1218, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 1200 and discussed above may contain a stand-alone integrated circuit memory die that includes one or more arrays of non-volatile memory devices including one or more memory devices 100 coupled with transistor 1100.

In various implementations, the computing device 1200 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 1200 may be any other electronic device that processes data.

Figure 13:
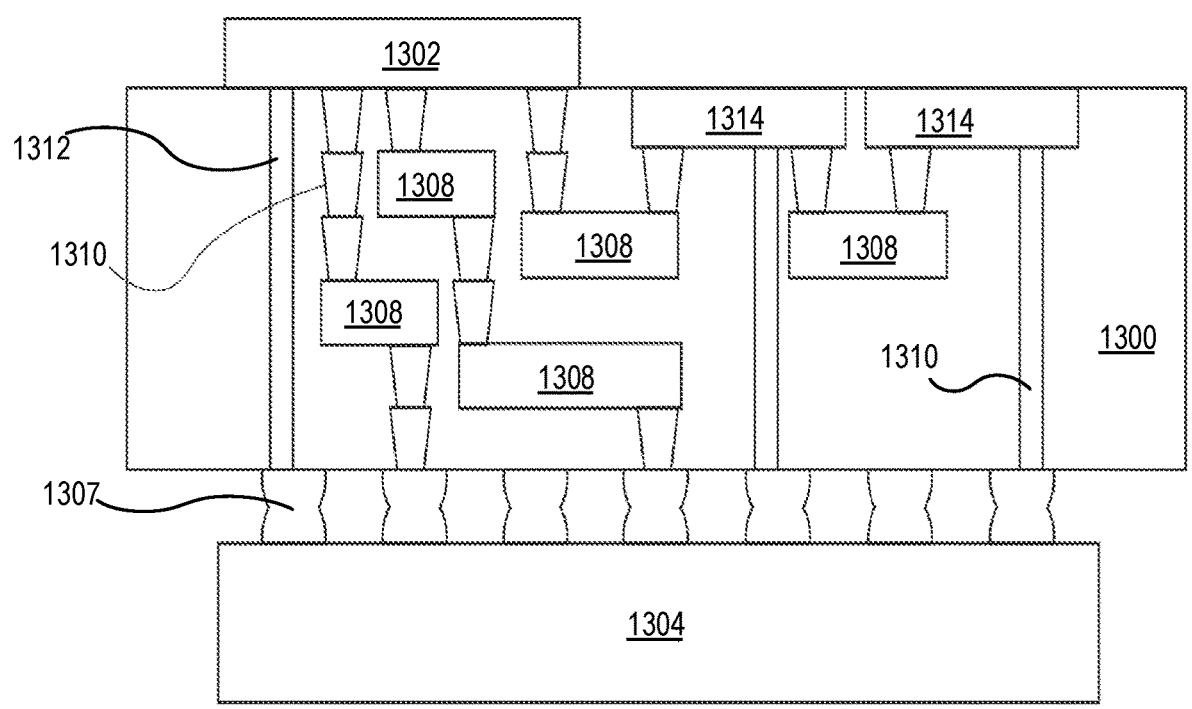
FIG. 13 illustrates an integrated circuit (IC) structure that includes one or more embodiments of the present disclosure.

FIG. 13 illustrates an integrated circuit (IC) structure 1300 that includes one or more embodiments of the disclosure. The integrated circuit (IC) structure 1300 is an intervening substrate used to bridge a first substrate 1302 to a second substrate 1304. The first substrate 1302 may be, for instance, an integrated circuit die. The second substrate 1304 may be, for instance, a memory module, a computer mother, or another integrated circuit die. Generally, the purpose of an integrated circuit (IC) structure 1300 is to spread a connection to a wider pitch or to reroute a connection to a different connection. For example, an integrated circuit (IC) structure 1300 may couple an integrated circuit die to a ball grid array (BGA) 1307 that can subsequently be coupled to the second substrate 1304. In some embodiments, the first and second substrates 1302/1304 are attached to opposing sides of the integrated circuit (IC) structure 1300. In other embodiments, the first and second substrates 1302/1304 are attached to the same side of the integrated circuit (IC) structure 1300. And in further embodiments, three or more substrates are interconnected by way of the integrated circuit (IC) structure 1300.

The integrated circuit (IC) structure 1300 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 1308 and vias 1310, including but not limited to through-silicon vias (TSVs) 1312. The integrated circuit (IC) structure 1300 may further include embedded devices 1314, including both passive and active devices. Such embedded devices 1314 include capacitors, decoupling capacitors, resistors, inductors, fuses, diodes, transformers, device structure including transistors, such as transistor 1100 (described in FIG. 11) coupled with a with one at least one nonvolatile memory device such as memory device 100 having spin orbit electrode coupled with a material layer stack 102 including a perpendicular magnetic tunnel junction 105 and magnet structure 106, in accordance with an embodiment of the present disclosure. The integrated circuit (IC) structure 1300 may further include embedded devices 1314 such as one or more resistive random-access devices, sensors, and electrostatic discharge (ESD) devices. More complex devices such as radio-frequency (RF) devices, power amplifiers, power management devices, antennas, arrays, sensors, and MEMS devices may also be formed on the integrated circuit (IC) structure 1300. In accordance with embodiments of the present disclosure, apparatuses or processes disclosed herein may be used in the fabrication of integrated circuit (IC) structure 1300.

Accordingly, one or more embodiments of the present disclosure relate generally to the fabrication of embedded microelectronic memory. The microelectronic memory may be non-volatile, wherein the memory can retain stored information even when not powered. One or more embodiments of the present disclosure relate to the fabrication of a spin orbit memory device such as the spin orbit memory device 100 having a magnet structure with a reduced magnetic moment. The spin orbit memory devices 100 may be used in an embedded non-volatile memory application.

Thus, embodiments of the present disclosure include spin orbit memory devices with reduced magnetic moment and methods of fabrication.

In a first example, an apparatus includes a first magnetic layer having a first magnetization, a first layer including a first conductive material on the first magnetic layer, a second magnetic layer having the first magnetization on the first layer; a second layer including a second conductive material above the second magnetic layer and a stack on the second layer, wherein the stack includes a stack of bilayers. Each of the bilayers includes a third magnetic layer having a second magnetization and a non-magnetic layer on the third magnetic layer.

In second examples, for any of the first example, the first magnetic layer has a thickness between 0.3 nm and 0.6 nm.

In third examples, for any of the first through second examples, the second magnetic layer has a thickness between 0.4 nm and 0.8 nm.

In fourth examples, for any of the first through third examples, the first layer has a thickness between 1 nm and 2.0 nm.

In fifth examples, for any of the first through fourth examples, each of the first magnetic layer and the second magnetic layer include cobalt.

In sixth examples, for any of the first through fifth examples, the first conductive material includes platinum or palladium.

In seventh examples, for any of the first through sixth examples, the first magnetization is substantially antiparallel to the second magnetization.

In eighth examples, for any of the first through seventh examples, the non-magnetic layer in the stack includes platinum or palladium.

In ninth examples, for any of the first through eighth examples, the stack includes between 3 and 10 bilayers.

In tenth examples, for any of the first through ninth examples, the first layer includes platinum, where the non-magnetic layer in the stack of bilayers includes platinum, and where the first layer including platinum has a thickness that is less than a combined thickness of the non-magnetic layers including platinum in the stack of bilayers.

In eleventh examples, for any of the first through tenth examples, the first magnetic layer, the conductive layer and the second magnetic layer comprise a combined first volume, the stack of bilayers comprises a second volume, and the first volume is less than the second volume.

In twelfth examples, for any of the first through eleventh examples, the second conductive material includes tantalum, tungsten, iridium or ruthenium, and the second layer has a thickness between 0.5 nm and 1 nm.

In a thirteenth example, an electrode including a spin orbit material and a material layer stack on a portion of the first electrode. The material layer stack includes a synthetic anti-ferromagnet film (SAF) structure including a first magnetic layer having a first magnetization, a first layer including a first conductive material on the first magnetic layer, a second magnetic layer having the first magnetization on the first layer, a second layer including a second conductive material above the second magnetic layer. The material layer stack further includes a stack on the second layer, where the stack includes a stack of bilayers, and where each of the bilayers includes a third magnetic layer having a second magnetization and a non-magnetic layer on the third magnetic layer. The material layer stack further includes a structure between the electrode and the SAF structure, where the structure includes a third layer including molybdenum, a fourth magnetic layer on the third layer and a fourth layer including tantalum on the fourth magnetic layer. The material layer stack further includes a magnetic junction between the structure and the electrode.

In fourteenth examples, for any of the thirteenth example, the magnetic junction includes a first magnet with a third magnetization in contact with the electrode, a fourth layer on the first magnet and a second magnet on the fourth layer, where the second magnet has the first magnetization.

In fifteenth examples, for any of the thirteenth through fourteenth examples, the first magnetic layer, the second magnetic layer, the fourth magnetic layer, and the second magnet, include a combined first magnetic moment and the stack includes a second magnetic moment, and wherein the first magnetic moment is less than the second magnetic moment.

In sixteenth examples, for any of the thirteenth through fifteenth examples, the first magnetic layer, the first layer, the second magnetic layer, the structure and the second magnet include a combined first volume and the stack includes a second volume, and wherein the first volume is less than the second volume.

In seventeenth examples, for any of the thirteenth through sixteenth examples, the fourth magnetic layer, the first magnet and the second magnet each include cobalt, iron and boron, and wherein the third magnetic layer includes more boron than the fourth magnetic layer or the fifth magnetic layer.

In eighteenth examples, for any of the thirteenth through seventeenth examples, the conductive layer includes platinum and the non-magnetic material in the stack of bilayers includes platinum, and wherein the conductive layer including platinum has a thickness that is less than a combined thickness of the platinum in the stack of bilayers.

In a nineteenth example, a system includes a processor and a radio transceiver coupled to the processor. The transceiver includes a transistor including a drain contact coupled to a drain, a source contact coupled to a source and a gate contact coupled to a gate. The system further includes a memory device coupled with the drain contact. The memory device includes an electrode including a spin orbit material and a material layer stack on a portion of the first electrode. The material layer stack includes a synthetic anti-ferromagnet film (SAF) structure including a first magnetic layer having a first magnetization, a first layer including a first conductive material on the first magnetic layer, a second magnetic layer having the first magnetization on the first layer, a second layer including a second conductive material above the second magnetic layer and a stack on the second layer. The stack includes a stack of bilayers, where each of the bilayers includes a third magnetic layer having a second magnetization and a non-magnetic layer on the third magnetic layer. The material layer stack further includes a structure between the electrode and the SAF structure. The structure includes a third layer including molybdenum, a fourth magnetic layer on the third layer and a fourth layer including tantalum on the fourth magnetic layer. The material layer stack further includes a magnetic tunnel junction between the SAF structure and the electrode.

In twentieth examples, for any of the nineteenth example, the system further includes a battery coupled to power at least one of the processor or memory.

What is claimed is:

1. An apparatus, comprising:
   a magnetic tunnel junction (MTJ) comprising a free magnet and a fixed magnet;
   a synthetic anti-ferroelectric (SAF) structure over the MTJ, the SAF structure comprising:
      a first magnet structure comprising:
         a first magnetic layer having a first magnetization;
         a first non-magnetic layer comprising a first conductive material on the first magnetic layer;
         a second magnetic layer having the first magnetization on the first non-magnetic layer;
      a coupling layer comprising a second conductive material, different than the first conductive material, above the first magnet structure; and
      a second magnet structure on the coupling layer, wherein the second magnet structure comprises a plurality of bilayers with more layers than the first magnet structure, wherein each of the bilayers comprises a third magnetic layer having a second magnetization, substantially antiparallel to the first magnetization, and a second non-magnetic layer on the third magnetic layer.

2. The apparatus of claim 1, wherein the first magnetic layer has a thickness between 0.3 nm and 0.6 nm.

3. The apparatus of claim 1, wherein the second magnetic layer has a thickness between 0.4 nm and 0.8 nm.

4. The apparatus of claim 1, wherein the first non-magnetic layer has a thickness between 1 nm and 2.0 nm.

5. The apparatus of claim 1, wherein each of the first magnetic layer and the second magnetic layer include cobalt.

6. The apparatus of claim 1, wherein the first non-magnetic layer comprises platinum or palladium.

7. The apparatus of claim 1, wherein the second non-magnetic layer comprises platinum or palladium.

8. The apparatus of claim 1, wherein the first magnet structure consists of the first non-magnetic layer and the first and second magnetic layers, and wherein the second magnet structure has between 3 and 10 bilayers.

9. The apparatus of claim 1, wherein the first non-magnetic layer comprises platinum, wherein the second non-magnetic layer comprises platinum, and wherein the first non-magnetic layer has a thickness that is less than a combined thickness of all the second non-magnetic layers within the second magnet structure.

10. The apparatus of claim 1, wherein the first magnetic layer, the first non-magnetic layer and the second magnetic layer comprise a combined first volume, wherein the plurality of bilayers comprises a second volume, and wherein the first volume is less than the second volume.

11. The apparatus of claim 1, wherein the second conductive material comprises tantalum, tungsten, iridium or ruthenium, and wherein the coupling layer has a thickness between 0.5 nm and 1 nm.

12. A memory device, comprising:
an electrode comprising a spin orbit material; and
a material layer stack on a portion of the first electrode, the material layer stack comprising:
a synthetic anti-ferromagnet film (SAF) structure comprising:
a first magnetic layer having a first magnetization;
a first layer comprising a first conductive material on the first magnetic layer;
a second magnetic layer having the first magnetization on the first layer;
a second layer comprising a second conductive material above the second magnetic layer; and
a stack on the second layer, wherein the stack comprises a stack of bilayers, wherein each of the bilayers comprises a third magnetic layer having a second magnetization and a non-magnetic layer on the third magnetic layer;
a structure between the electrode and the SAF structure, the structure comprising:
a third layer comprising molybdenum;
a fourth magnetic layer on the third layer; and
a fourth layer comprising tantalum on the fourth magnetic layer; and
a magnetic junction between the structure and the electrode.

13. The memory device of claim 12, wherein the magnetic junction comprises:
a first magnet with a third magnetization in contact with the electrode;
a fourth layer on the first magnet; and
a second magnet on the fourth layer, wherein the second magnet has the first magnetization.

14. The memory device of claim 12, wherein the first magnetic layer, the second magnetic layer, the fourth magnetic layer, and the second magnet, comprise a combined first magnetic moment and the stack comprises a second magnetic moment, and wherein the first magnetic moment is less than the second magnetic moment.

15. The memory device of claim 12, wherein the first magnetic layer, the first layer, the second magnetic layer, the structure and the second magnet comprise a combined first volume and the stack comprises a second volume, and wherein the first volume is less than the second volume.

16. The memory device of claim 12, wherein the fourth magnetic layer, the first magnet and the second magnet each comprise cobalt, iron and boron, and wherein the third magnetic layer comprises more boron than the fourth magnetic layer or the fifth magnetic layer.

17. The memory device of claim 12, wherein the conductive layer comprises platinum and the non-magnetic material in the stack of bilayers comprises platinum, and wherein the conductive layer comprising platinum has a thickness that is less than a combined thickness of the platinum in the stack of bilayers.

18. A system comprising:
a processor;
a radio transceiver coupled to the processor, wherein the transceiver includes a transistor comprising:
a drain contact coupled to a drain;
a source contact coupled to a source; and
a gate contact coupled to a gate; and
a memory device coupled with the drain contact, the memory device comprising:
an electrode comprising a spin orbit material; and
a material layer stack on a portion of the first electrode, the material layer stack comprising:
a synthetic anti-ferromagnet film (SAF) structure comprising:
a first magnetic layer having a first magnetization;
a first layer comprising a first conductive material on the first magnetic layer;
a second magnetic layer having the first magnetization on the first layer;
a second layer comprising a second conductive material above the second magnetic layer; and
a stack on the second layer, wherein the stack comprises a stack of bilayers, wherein each of the bilayers comprises a third magnetic layer having a second magnetization and a non-magnetic layer on the third magnetic layer;
a structure between the electrode and the SAF structure, the structure comprising:
a third layer comprising molybdenum;
a fourth magnetic layer on the third layer; and
a fourth layer comprising tantalum on the fourth magnetic layer; and
a magnetic tunnel junction between the SAF structure and the electrode.

19. The system of claim 18, further comprising a battery coupled to power at least one of the processor or memory.

* * * * *